US012098522B2

(12) United States Patent
Watanabe et al.

(10) Patent No.: US 12,098,522 B2
(45) Date of Patent: Sep. 24, 2024

(54) ELECTRICITY STORAGE DEVICE MANAGEMENT COMPUTER FOR A CONSTRUCTION MACHINE

(71) Applicant: Hitachi Construction Machinery Co., Ltd., Tokyo (JP)

(72) Inventors: Akira Watanabe, Ushiku (JP); Ken Takeuchi, Kasumigaura (JP); Itaru Naya, Tsuchiura (JP)

(73) Assignee: Hitachi Construction Machinery Co., Ltd., Tokyo (JP)

( * ) Notice: Subject to any disclaimer, the term of this patent is extended or adjusted under 35 U.S.C. 154(b) by 1056 days.

(21) Appl. No.: 16/978,498

(22) PCT Filed: Jun. 25, 2019

(86) PCT No.: PCT/JP2019/025083
§ 371 (c)(1),
(2) Date: Sep. 4, 2020

(87) PCT Pub. No.: WO2020/004364
PCT Pub. Date: Jan. 2, 2020

(65) Prior Publication Data
US 2020/0399856 A1 Dec. 24, 2020

(30) Foreign Application Priority Data
Jun. 28, 2018 (JP) .................................. 2018-122889

(51) Int. Cl.
*E02F 9/20* (2006.01)
*B60L 58/10* (2019.01)
(Continued)

(52) U.S. Cl.
CPC ............ *E02F 9/2091* (2013.01); *B60L 58/10* (2019.02); *B60L 58/12* (2019.02); *E02F 9/26* (2013.01);
(Continued)

(58) Field of Classification Search
CPC ......... E02F 9/2091; E02F 9/26; E02F 9/2228; E02F 9/2285; E02F 9/2296; B60L 58/10;
(Continued)

(56) References Cited

U.S. PATENT DOCUMENTS

2017/0016961 A1\* 1/2017 Lucea ....................... B60L 3/12
2017/0170668 A1 6/2017 Hayashizaki et al.

FOREIGN PATENT DOCUMENTS

JP 2007-113953 A 5/2007
JP 2016-111808 A 6/2016
(Continued)

OTHER PUBLICATIONS

Google English Translation of JP2016111808A (Year: 2016).\*
(Continued)

*Primary Examiner* — James J Lee
*Assistant Examiner* — Andrew Sang Kim
(74) *Attorney, Agent, or Firm* — Crowell & Moring LLP

(57) ABSTRACT

A management server receives a maximum value and a minimum value of the respective voltages in a plurality of battery cells configuring an electricity storage device of a hydraulic excavator from the hydraulic excavator, and stores the values in a storage device. Discharge characteristics of the electricity storage device are stored in the storage device in the management server. A battery state estimation calculating unit in the management server calculates an estimation maximum value and an estimation minimum value of cell voltages in the present or in the future by adding the discharge characteristics stored in the storage device to the latest maximum value and the latest minimum value of the cell voltages stored in the storage device. A management information producing unit outputs information based upon
(Continued)

the estimation maximum value and the estimation minimum value of the cell voltages calculated in the battery state estimation calculating unit.

3 Claims, 5 Drawing Sheets

(51) Int. Cl.
| | |
|---|---|
| *B60L 58/12* | (2019.01) |
| *E02F 9/22* | (2006.01) |
| *E02F 9/26* | (2006.01) |
| *G07C 5/02* | (2006.01) |
| *H01M 10/42* | (2006.01) |
| *H01M 10/48* | (2006.01) |
| *H02J 7/00* | (2006.01) |
| *H02J 13/00* | (2006.01) |

(52) U.S. Cl.
CPC ............ *G07C 5/02* (2013.01); *H01M 10/425* (2013.01); *H01M 10/48* (2013.01); *H01M 10/482* (2013.01); *H02J 7/00032* (2020.01); *H02J 7/0013* (2013.01); *H02J 13/00006* (2020.01); *B60L 2200/40* (2013.01); *E02F 9/2228* (2013.01); *E02F 9/2285* (2013.01); *E02F 9/2296* (2013.01); *H01M 2010/4271* (2013.01); *H01M 2010/4278* (2013.01); *H01M 2220/20* (2013.01); *H02J 2310/40* (2020.01)

(58) Field of Classification Search
CPC ....... B60L 58/12; B60L 2200/40; G07C 5/02; H01M 10/425; H01M 10/48; H01M 10/482; H01M 2010/4271; H01M 2010/4278; H01M 2220/20; H02J 7/00032; H02J 7/0013; H02J 13/00006; H02J 2310/40; H02J 2310/46; H02J 7/00; H02J 7/0048; H02J 13/00; Y02T 90/167; Y02T 10/70; Y02E 60/10; Y04S 30/12; G01R 31/36; G01R 31/371; G01R 31/392; G01R 19/10; G01R 19/30; G01R 31/382; G08B 21/18

See application file for complete search history.

(56) References Cited

FOREIGN PATENT DOCUMENTS

| | | |
|---|---|---|
| JP | 2017-110969 A | 6/2017 |
| KR | 10-2011-0081604 A | 7/2011 |
| KR | 20120010189 A * | 7/2011 |

OTHER PUBLICATIONS

Google English Translation of KR-20120010189-A (Year: 2012).*

Merged Foreign and English Translation of RU 2016113909 A (Year: 2017).*

Korean-language Office Action issued in Korean Application No. 10-2020-7025479 dated Jun. 15, 2022 with English translation (10 pages).

International Search Report (PCT/ISA/210) issued in PCT Application No. PCT/JP2019/025083 dated Sep. 17, 2019 with English translation (four (4) pages).

Japanese-language Written Opinion (PCT/ISA/237) issued in PCT Application No. PCT/JP2019/025083 dated Sep. 17, 2019 (four (4) pages).

* cited by examiner

ELECTRICITY STORAGE DEVICE MANAGEMENT COMPUTER FOR A CONSTRUCTION MACHINE

TECHNICAL FIELD

The present invention relates to a construction machine management system that manages (grasps and monitors) a construction machine such as a hydraulic excavator, a hydraulic crane or a wheel loader in a position away from this construction machine.

BACKGROUND ART

For example, a hybrid hydraulic excavator (hybrid excavator) and an electric hydraulic excavator (battery excavator) operate using power stored (charged) in an electricity storage device as a power source. The electricity storage device includes a storage battery (secondary battery), a control unit (BCU), a relay and the like. As the storage battery, for example, a lithium-ion battery is used. The storage battery (lithium-ion battery) is mostly used in a state of an assembled battery in which a plurality of battery cells (lithium-ion battery cells) are connected.

It is not preferable that the lithium-ion battery causes overcharge or over discharge in view of securement of safety or suppression of performance degradation. Therefore, it is preferable that the lithium-ion battery is used while being managed to prevent a state of the overcharge or over discharge. For example, it is preferable that the lithium-ion battery is used while monitoring an average charge remaining amount of the connected battery cells, and a maximum cell voltage and a minimum cell voltage of all the battery cells. In addition, it is preferable to manage the lithium-ion battery by performing restriction of charge and discharge as needed and balancing of voltages (cell voltages) of the respective battery cells.

On the other hand, in a case where the lithium-ion battery is mounted on the hydraulic excavator, the battery state is difficult to manage in a state where the hydraulic excavator is not operating. Therefore, there is a possibility that the management of the battery state is not executed for a long period of time depending on the use state of a user. On the other hand, Patent Document 1 describes the technology that a charge remaining amount of an electricity storage device is transmitted from a hydraulic excavator to a management device installed outside of the hydraulic excavator to execute the management in the management device. According to the technology in Patent Document 1, the management device uses data of self-discharge characteristics recorded in advance, estimates charge remaining amounts in the present and in the future from the charge remaining amount finally received, and outputs the result as needed.

PRIOR ART DOCUMENT

Patent Document

Patent Document 1: Japanese Patent Laid-Open No. 2016-111808 A

SUMMARY OF THE INVENTION

According to the technology as described in Patent Document 1, even when the hydraulic excavator is in the non-operating state, the management of the charge remaining amount in the electricity storage device mounted on the hydraulic excavator is made possible by the management device disposed (installed) away from the hydraulic excavator. However, Patent Document 1 does not describe a point of managing a voltage difference in battery cells, that is, a cell voltage difference in a case where an electricity storage device is configured of, for example, assembled batteries each formed by combining a plurality of lithium-ion battery cells.

Here, the cell voltage difference is a difference (voltage difference) between a maximum value and a minimum value of the respective voltages (cell voltages) in the plurality of battery cells. That is, the cell voltage difference is a difference between a maximum cell voltage and a minimum cell voltage of all the battery cells used in the assembled battery. The cell voltage difference is caused by variations in the manufacture of the battery cells. The cell voltage difference possibly becomes larger as the self-discharge is progressed during a long-term storage because of a difference in capacity (internal resistance) of the cell or a difference in self-discharge amount of the cell. In addition, in a state where the cell voltage difference is made, even when the charge and discharge are performed under management of the charge remaining amount, overcharge (or over discharge) possibly occurs in a specific battery cell having a high (or a low) voltage. Therefore, it is preferable that the control device configured to control the charge and discharge of the electricity storage device, for example, always monitors the cell voltage difference during the operating time, and in a case where a constant or more voltage difference occurs, takes measures of restricting the charge and discharge or the like.

On the other hand, in the construction machine such as the hydraulic excavator, the cell voltage difference becomes possibly large after a long-term vehicle rest when the construction machine is caused not to operate for a long period of time. In this case, that is, in a case where the cell voltage difference becomes large, it is assumed to restrict use of the electricity storage device for suppressing the overcharge (or the over discharge). However, when the use of the electricity storage device is restricted, for example, in a case of the hybrid hydraulic excavator, the hydraulic excavator operates with a power source of an engine only, possibly restricting the operation. In addition, in the electric hydraulic excavator, there is a possibility that it becomes impossible to operate the hydraulic excavator (that is, it becomes impossible to use it).

An object of the present invention is to provide a construction machine management system that can suppress restriction of an operation of a construction machine caused by a voltage difference (cell voltage difference) in a plurality of battery cells configuring an electricity storage device in a construction machine.

The present invention relates to a construction machine management system provided with a management device that is disposed in a position away from a construction machine including an electricity storage device and a communication device and manages the electricity storage device by receiving information of the electricity storage device transmitted through the communication device from the construction machine, characterized in that: the information of the electricity storage device includes: information including a maximum value and a minimum value of respective voltages in a plurality of battery cells configuring the electricity storage device; or information including a maximum value and a minimum value of respective charging rates in the plurality of battery cells, and the management device: stores the maximum value and the minimum value, and discharge characteristics of the electricity storage device; calculates an estimation maximum value and an estimation minimum value in the present or in the future by adding the discharge characteristics stored in the management device to the latest maximum value and the latest minimum value stored in the management device; and outputs information based upon the calculated estimation maximum value and the calculated estimation minimum value.

According to the present invention, it is possible to suppress the restriction on the operation of the construction machine caused by an increase of the voltage difference (cell voltage difference) in the plurality of battery cells configuring the electricity storage device in the construction machine.

That is, the information of the electricity storage device transmitted from the construction machine, specifically the maximum value and the minimum value of the respective voltages in the plurality of battery cells configuring the electricity storage device in the construction machine or the maximum value and the minimum value of the respective charging rates in the plurality of battery cells are stored in the management device. In addition, in the management device the estimation maximum value and the estimation minimum value in the present or in the future are calculated by adding the discharge characteristics to the latest maximum value and the latest minimum value. Therefore, the management device can manage the battery state (for example, the voltage difference or the charging rate difference in the battery cells) of the electricity storage device also during the non-operating time of the construction machine, based upon the estimation maximum value and the estimation minimum value. That is, the management device can estimate the voltage difference (or the charging rate difference) in the battery cells during the long-term vehicle rest as well. It is possible to confirm the battery state of the electricity storage device based upon the estimated voltage difference (or the estimated charging rate difference).

In addition, the management device outputs information based upon the estimation maximum value and the estimation minimum value (for example, the estimated voltage difference, the estimated charging rate difference, a vehicle rest possible period calculated by them or the like). Thereby, it is possible to notify the effect that the voltage difference (or the charging rate difference) in the battery cells is large, the effect that the operation (for example, a maintenance operation) of the construction machine is necessary or the like. Therefore, based upon this output (notification), a manager (for example, an owner, a user, an operator or a maintenance responsible worker) of the construction machine can take the measures (for example, the maintenance operation) before the operation of the construction machine is restricted due to the voltage difference (or the charging rate difference) in the battery cells, or before it becomes impossible to operate the construction machine. As a result, it is possible to suppress the operation of the construction machine from being restricted or the construction machine from being unable to be used after the long-term vehicle rest of the construction machine.

MODE FOR CARRYING OUT THE INVENTION

Hereinafter, an explanation will be in detail made of a construction machine management system according to an embodiment in the present invention with reference to the accompanying drawings by taking a case of being applied to a management system in a hydraulic excavator as a representative example of the construction machine, as an example. It should be noted that each step in a flow chart illustrated in FIG. 4 uses notation of "S" (for example, step 1="S1").

Figure 1:
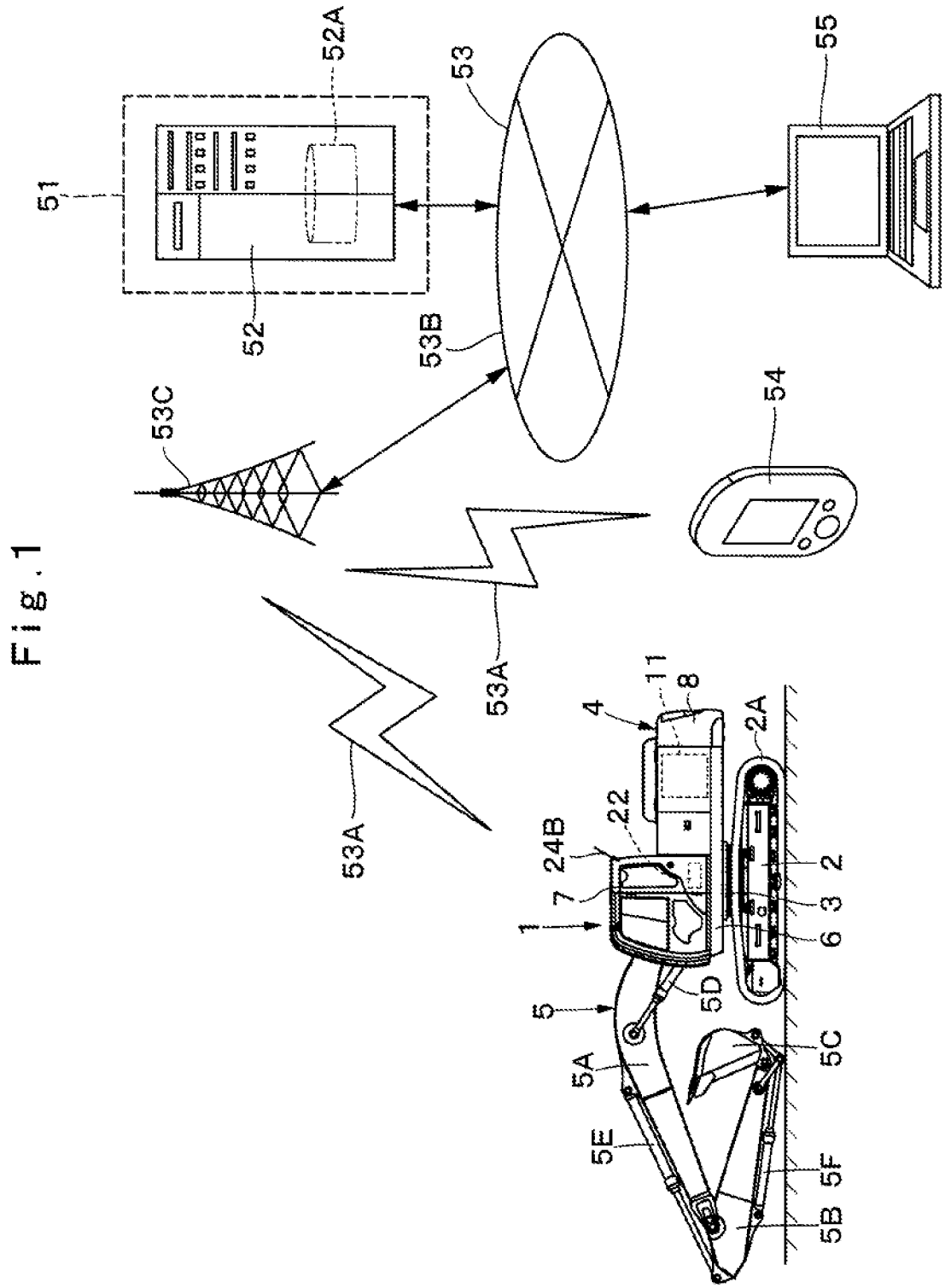
FIG. 1 is an entire configuration diagram illustrating a hydraulic excavator and a construction machine management system provided with a management device according to an embodiment of the present invention.

FIG. 1 to FIG. 5 illustrate an embodiment. FIG. 1 thereof illustrates a hydraulic excavator 1 as a construction machine and a management server 52 as a management device for performing transmission and reception of information (data) to and from the hydraulic excavator 1. In the embodiment, the hydraulic excavator 1 is configured as a hybrid hydraulic excavator (hybrid excavator) that is provided with an engine 11 and an assist power generation motor 15 (refer to FIG. 2) as an electric motor, and an electricity storage device 19 (refer to FIG. 2). On the other hand, the management server 52 is installed in a position away from the hydraulic excavator 1. The management server 52 manages (grasps and monitors) a state of the hydraulic excavator 1 remotely. The construction machine management system (remote monitoring system) is configured of the management server 52 and the hydraulic excavator 1.

The construction machine management system is configured to be capable of establishing interactive communications through communication lines 53 including wireless communication lines 53A between the hydraulic excavator 1 and the management server 52. That is, the management server 52 and the hydraulic excavator 1 in a remote place therefrom are connected through the wireless communication lines 53A, thereby making it possible to perform transmission and reception of the information (data) with each other. For example, the hydraulic excavator 1 transmits information (state information on each part of a vehicle body, including state amount information and warning information of the electricity storage device 19, for example) of the hydraulic excavator 1 itself to the management server 52 as operating data (daily report data) at the end of operation (or at the specific time). The management server 52 receives the state information (operating data) through the communication lines 53 from the hydraulic excavator 1, thereby making it possible to grasp the state of the hydraulic excavator 1. Therefore, the hydraulic excavator 1 has a function of generating (collecting and obtaining) the state information of each part in the vehicle body (vehicle body state information) and a function of transmitting this state information through the communication lines 53 to the management server 52 as the operating data.

In FIG. 1, the hydraulic excavator 1 is shipped from a factory of a manufacturer (maker) of the hydraulic excavator 1 and operates in a working site (construction site) for performing a civil engineering work, a construction work, a demolition work, a dredging work and the like. In FIG. 1, for simplification of the drawing, only one hydraulic excavator 1 is illustrated, but in fact, the plurality of hydraulic excavators 1 operate in various kinds of working sites. In other words, the management server 52 in the construction machine management system not only manages (grasps and monitors) the state of the single hydraulic excavator 1, but also can manage the states of the plurality of hydraulic excavators 1 individually, that is, for each of the hydraulic excavators 1. In this case, the management server 52 receives the state information (operating data) from the plurality of hydraulic excavators 1 and manages it for each of the hydraulic excavators 1.

A management center 51 is provided with the management server 52 configuring the construction machine management system. The management center 51 (that is, the management server 52) is installed in a position away from the hydraulic excavator 1, for example, in a main office, a branch office, a factory or the like in the manufacturer of the hydraulic excavator 1. It should be noted that the management center 51 is not limited to the facilities of the manufacturer and may be installed, for example, in the data center or the like for professionally performing an operation of a server. The management server 52 in the management center 51 is connected to the hydraulic excavator 1 through the communication lines 53 such as private lines, public lines, Internet lines, optical lines, phone lines, wired lines, wireless lines, satellite lines or mobile lines.

In this case, the hydraulic excavator 1 is connected to the management server 52 through the communication lines 53 including wireless communication lines 53A and Internet lines 53B, for example. The wireless communication lines 53A are communication lines, which use radio waves based upon a wireless communication standard, such as a cellar phone communication network, a satellite communication network or a wireless LAN. In FIG. 1, for example, the hydraulic excavator 1 and a wireless base station 53C are connected by the wireless communication lines 53A of a cellar phone communication network (mobile communication network). In this case, the wireless base station 53C is a relay station and is operable to enable interactive communications between the wireless communication lines 53A and Internet lines 53B. As a result, the hydraulic excavator 1 can perform the transmission and reception (interactive communications) of information (data) between the hydraulic excavator 1 and the management server 52 via the wireless base station 53C.

On the other hand, the management server 52 is connected via the communication lines 53 to information terminals 54, 55 such as cellar phones, smartphones, tablet computers (tablet PCs), notebook computers (note PCs), and disc top computers (disc top PCs). It should be noted that in FIG. 1, one information terminal 54 is illustrated as a smartphone and the other information terminal 55 is illustrated as a note PC, but these terminals are not limited thereto. That is, as the information terminals 54, 55, various computers and communication equipment devices which can serve as interfaces for establishing input and output (transmission and reception) of data (information) between the management server 52 and them, may be used. The information terminals 54, 55 are terminals that enable communications via the Internet lines 53B and are provided with a Web browser function, for example.

Here, by connecting the one information terminal 54 in FIG. 1 via the wireless base station 53C to the Internet line 53B to access the management server 52, the information of the hydraulic excavator 1 (for example, state information of the vehicle body including a later-described, vehicle rest possible period and warning information based upon the vehicle rest possible period) stored (accumulated) in the management server 52 can be browsed. This information terminal 54 may be composed of a mobile information terminal such as a smartphone, or a tablet PC. In addition, by connecting the other information terminal 55 in FIG. 1 to the Internet line 53B to access the management server 52, the information of the hydraulic excavator 1 (for example, the state information of the vehicle body including the later-described, vehicle rest possible period and the warning information based upon the vehicle rest possible period) stored (accumulated) in the management server 52 can be browsed. This other information terminal 55 may include a personal computer (PC), for example.

The information terminals 54, 55 are used by users of the hydraulic excavator 1, such as an operator, an owner (owned company), and a manager (management company). In addition, the information terminals 54, 55 are used by service members (maintenance workers and maintenance responsible members) that perform maintenance (repair and management) of the hydraulic excavator 1 in a sales outlet (representative office) for the hydraulic excavator 1, in a service factory (maintenance factory) or the like for performing the maintenance of the hydraulic excavator 1. Further, the information terminals 54, 55 are used by designers performing managements, developments, designs and the like of the hydraulic excavator 1 in the office of a manufacturer, such as a main office, a branch office, a factory, a branch store of the manufacturer. It should be noted that in the following explanation, persons, including users and the like of the hydraulic excavator 1, who directly manage the hydraulic excavator 1 are called as managers.

Figure 2:
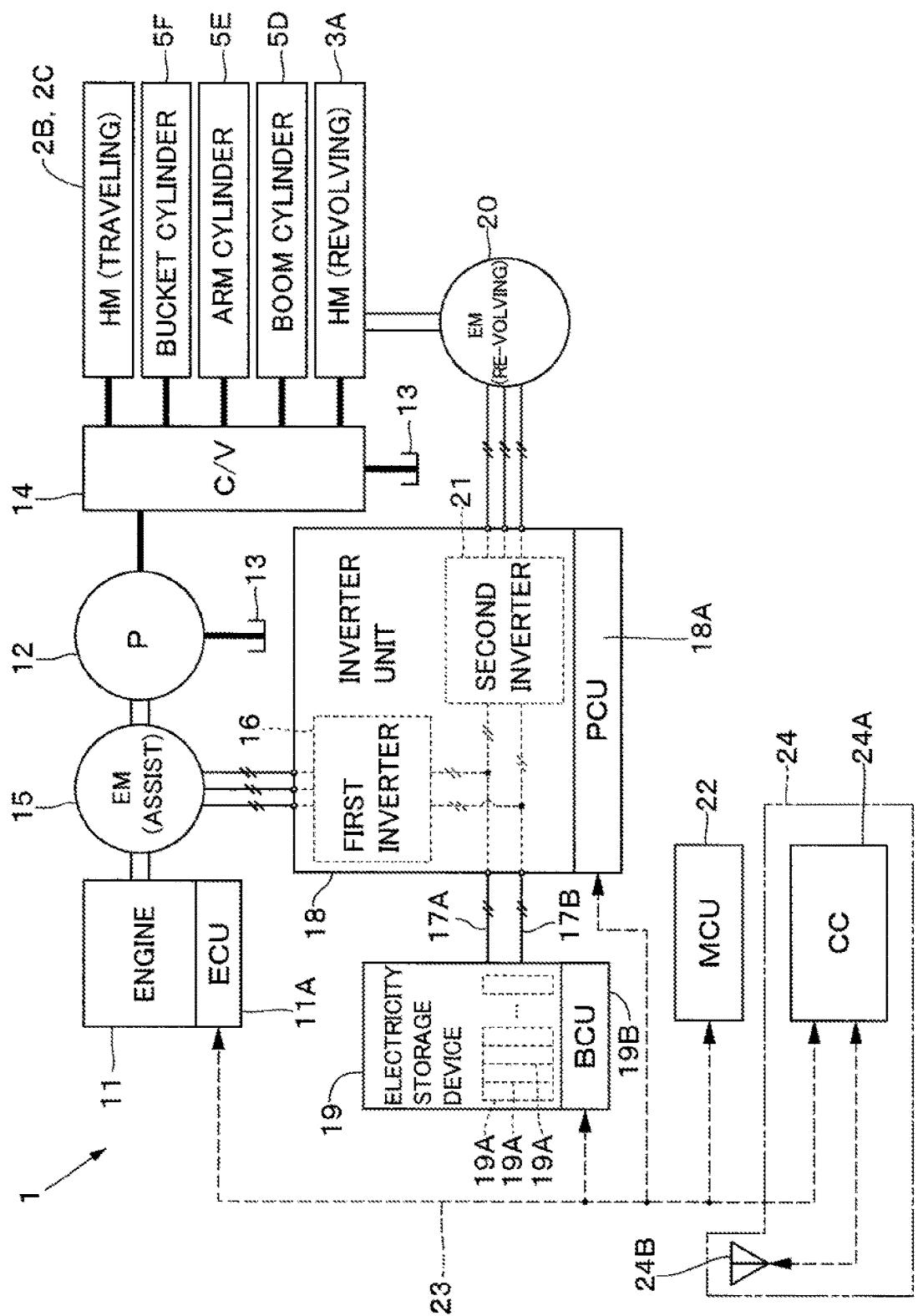
FIG. 2 is a block diagram illustrating a hydraulic system and an electric system in the hydraulic excavator in FIG. 1.

On the other hand, the management server 52 is connected via the communication line 53 to the hydraulic excavator 1. More specifically, the management server 52 is configured to be capable of being connected to (communicated with) the hydraulic excavator 1 via the wireless communication line 53A such as the mobile communication line or the satellite communication line. Therefore, the hydraulic excavator 1 is, as illustrated in FIG. 2 described later, provided with a communication device 24 including a communication antenna 24B.

The management server 52 manages the information (state information) of the vehicle body transmitted from the hydraulic excavator 1. That is, the management server 52 stores (accumulates) therein the information transmitted from the hydraulic excavator 1 and outputs this information to the information terminals 54, 55 as needed. For example, the management server 52 receives information transmitted from a plurality of hydraulic excavators 1 respectively operating in various sites to grasp (manage) the states of the hydraulic excavators 1 for each of the hydraulic excavators 1.

In this case, the management server 52 processes the state information of the hydraulic excavator 1 in such a state as to be capable of being browsed by a Web browser. The management server 52 outputs the information of the hydraulic excavator 1 to the information terminals 54, 55 based upon access (instruction) from the information terminals 54, 55. That is, the manager of the hydraulic excavator 1 can browse the state information of the hydraulic excavator 1 by using the Web browsing function of the information terminals 54, 55. In addition, the information terminals 54, 55 are terminals enabling email communications via the Internet line 53B. The management server 52 produces the warning information based upon the state information of the hydraulic excavator 1, for example, and can transmit the warning information to an email address of the manager of the hydraulic excavator 1. The manager of the hydraulic excavator 1 can receive the warning information by the email communication function of the own information terminals 54, 55.

As described later, in the embodiment the management server 52 receives the information of the electricity storage device 19 from the hydraulic excavator 1. The management server 52 stores therein the received information of the electricity storage device 19, and calculates the vehicle rest possible period of the hydraulic excavator 1 based upon the information, that is, a period until restriction on use of the electricity storage device 19 in the hydraulic excavator 1 starts due to self-discharge (desired use thereof cannot be performed). The management server 52 outputs the information of the vehicle rest possible period or the warning information based upon the vehicle rest possible period to the information terminals 54, 55 to be used by the manager of the hydraulic excavator 1 by email transmission. On the other hand, the manager of the hydraulic excavator 1 can access the management server 52 with the Web browser by using the information terminals 54, 55. As a result, the manager can browse the information of the vehicle rest possible period of the hydraulic excavator 1 or the warning information based upon the vehicle rest possible period.

Next, an explanation will be made of the hydraulic excavator 1 that operates in the working site.

As illustrated in FIG. 1, the hydraulic excavator 1 as a representative example of the hybrid construction machine includes an automotive lower traveling structure 2 of a crawler type, an upper revolving structure 4 that is mounted through a revolving device 3 on the lower traveling structure 2 to be capable of revolving thereon, and a working mechanism 5 of an articulated structure that is provided in the front side of the upper revolving structure 4 and performs an excavating operation and the like. In this case, the lower traveling structure 2 and the upper revolving structure 4 configure the vehicle body of the hydraulic excavator 1.

The lower traveling structure 2 includes, for example, crawler tracks 2A, and left and right traveling hydraulic motors 2B, 2C (refer to FIG. 2) causing the hydraulic excavator 1 to travel by causing the crawler tracks 2A to be driven and circulated. The lower traveling structure 2 travels together with the upper revolving structure 4 and the working mechanism 5 by rotation of the traveling hydraulic motors 2B, 2C as hydraulic motors (hydraulic actuators), based upon delivery of pressurized oil from a hydraulic pump 12 to be described later (refer to FIG. 2).

The working mechanism 5 called a working machine or a front is attached on the revolving frame 6 of the upper revolving structure 4. The working mechanism 5 is configured of, for example, a boom 5A, an arm 5B and a bucket 5C as a working tool, and a boom cylinder 5D, an arm cylinder 5E and a bucket cylinder (a working tool cylinder) 5F as hydraulic cylinders (hydraulic actuators), which drive (rotate) them. The working mechanism 5 operates by expansion or contraction of the cylinders 5D, 5E, 5F as the hydraulic cylinders, based upon the delivery of pressurized oil from the hydraulic pump 12.

The upper revolving structure 4 is mounted on the lower traveling structure 2 through the revolving device 3 including revolving bearings, a speed reducing mechanism, a revolving hydraulic motor 3A (refer to FIG. 2), a later-described revolving electric motor 20 (refer to FIG. 2) and the like. The revolving hydraulic motor 3A as a hydraulic motor (hydraulic actuator) rotates based upon the delivery of pressurized oil from the hydraulic pump 12. The revolving electric motor 20 rotates based upon the supply of power from the electricity storage device 19. The upper revolving structure 4 revolves together with the working mechanism 5 on the lower traveling structure 2 with rotation of the revolving hydraulic motor 3A and/or the revolving electric motor 20.

The upper revolving structure 4 includes the revolving frame 6 as a support structure (a base frame) of the upper revolving structure 4, a cab 7 mounted on the revolving frame 6, a counterweight 8 and the like. In this case, the engine 11, the hydraulic pump 12, a hydraulic oil tank 13, a control valve device (C/V) 14, the assist power generation motor 15, the electricity storage device 19 and the like, which are illustrated in FIG. 2, are mounted on the revolving frame 6. The revolving frame 6 is attached via the revolving device 3 to the lower traveling structure 2. The cab 7 defining therein an operation room is disposed in the front left side of the revolving frame 6. The counterweight 8 is located in the rear end side of the revolving frame 6 to act as a weight balance to the working mechanism 5. In addition, the engine 11, the assist power generation motor 15 and the hydraulic pump 12 are provided on the revolving frame 6 to be positioned in front of the counterweight 8.

An operator's seat (unillustrated) on which an operator sits is disposed within the cab 7. Operation devices for operating the hydraulic excavator 1 (specifically, a traveling lever/pedal operation device and a working lever operation device) are arranged on the periphery of the operator's seat. The operation device outputs a pilot signal (a pilot pressure) in response to an operation (a lever operation or a pedal operation) by the operator to the control valve device 14. As a result, the operator can operate (drive) the traveling hydraulic motors 2B, 2C, the cylinders 5D, 5E, 5F in the working mechanism 5 and the revolving hydraulic motor 3A in the revolving device 3.

As illustrated in FIG. 2, the hydraulic excavator 1 is configured to mount thereon an electric system that controls the assist power generation motor 15 and the like, and a hydraulic system that controls operations of the working mechanism 5 and the like. Therefore, an explanation will be made of the system configuration in the hydraulic excavator 1 with reference to FIG. 2 as well in addition to FIG. 1.

The engine 11 is mounted on the revolving frame 6 and is configured of an internal combustion engine such as a diesel engine. The hydraulic pump 12 and the assist power generation motor 15, which will be described later, are attached mechanically to the output side of the engine 11 for serial connection. The hydraulic pump 12 and the assist power generation motor 15 are driven and rotated by the engine 11. The engine 11 is controlled by an engine control unit 11A (hereinafter, referred to as "ECU 11A"). That is, the ECU 11A is an engine controller (control device) that monitors and controls a state of the engine 11.

The ECU 11A is configured of, for example, a microcomputer and the like, and is provided with a CPU (central processor unit), a memory and the like. The ECU 11A is connected to a later-described main control unit 22 (hereinafter, referred to as "MCU 22"). The ECU 11A variably controls a fuel injection amount into cylinders (combustion chambers) of the engine 11 based upon a control signal (an instruction signal) from the MCU 22, for example, to control a rotational speed of the engine 11 (an engine speed). That is, the ECU 11A controls an output torque and the rotational speed and the like of the engine 11 based upon an engine output instruction from the MCU 22. It should be noted that a maximum output of the engine 11 is smaller than maximum power of the hydraulic pump 12, for example.

The hydraulic pump 12 as a main pump is connected mechanically (that is, to be power transferable) to the engine 11. The hydraulic pump 12 can be driven by the torque of the engine 11 alone. In addition, the hydraulic pump 12 can be driven by a compound torque (a total torque) acquired by adding an assist torque of the assist power generation motor 15 to the torque of the engine 11. The hydraulic pump 12 is configured of, for example, a variable displacement hydraulic pump, more specifically a variable displacement hydraulic pump of a swash plate type, a bent axis type or a radial piston type. The hydraulic pump 12 pressurizes hydraulic oil reserved in the hydraulic oil tank 13, which is delivered as the pressurized oil to the traveling hydraulic motors 2B, 2C, the revolving hydraulic motor 3A, and the cylinders 5D to 5F of the working mechanism 5.

The hydraulic pump 12 is connected through the control valve device 14 called the control valve (C/V) to the hydraulic actuators, that is, the traveling hydraulic motors 2B, 2C, the revolving hydraulic motor 3A, and the cylinders 5D to 5F in the working mechanism 5. The traveling hydraulic motors 2B, 2C, the revolving hydraulic motor 3A, and the cylinders 5D to 5F in the working mechanism 5 are driven by the pressurized oil delivered from the hydraulic pump 12. The control valve device 14 is a control valve group formed of a plurality of directional control valves. The control valve device 14 distributes or discharges the pressurized oil delivered from the hydraulic pump 12 to or from the traveling hydraulic motors 2B, 2C, the revolving hydraulic motor 3A, and the cylinders 5D to 5F in the working mechanism 5 in response to operations of the operation devices (the traveling lever/pedal operation device and the working lever operation device).

The assist power generation motor 15 as a motor generator is connected mechanically to the engine 11. The assist power generation motor 15 is configured of, for example, a synchronous electric motor or the like. The assist power generation motor 15 is driven and rotated by the engine 11 to generate power or assists in a drive of the engine 11 with supply of power. That is, the assist power generation motor 15 performs power generation of performing power supply to the electricity storage device 19 or the revolving electric motor 20 by acting as an electric motor using the engine 11 as a power source, and power running of assisting in the drive of the engine 11 by acting as a motor using power from the electricity storage device 19 or the revolving electric motor 20 as a power source.

Accordingly, the assist torque of the assist power generation motor 15 is added to the torque of the engine 11 according to the state, and the hydraulic pump 12 is driven by these torques. In other words, the assist power generation motor 15 assists in a drive of the hydraulic pump 12 and generates power by extra energy of the engine 11. The assist power generation motor 15 is connected to a pair of DC buses 17A, 17B through a first inverter 16. The first inverter 16 configures an inverter unit 18 together with a second inverter 21 to be described later.

The first inverter 16 is configured using a plurality of switching elements such as a transistor and an insulating gate bipolar transistor (IGBT). An on/off operation of each of the switching elements in the first inverter 16 is controlled by a power control unit 18A (hereinafter, referred to as "PCU 18A"). As a result, generating power (regenerative power) at the power generation time and drive power at the power running time of the assist power generation motor 15 are controlled. That is, the PCU 18A is an inverter controller (control device) that monitors and controls states of the first inverter 16 and the later-described second inverter 21. The PCU 18A is configured of, for example, a microcomputer and the like, and is provided with a CPU (central processor unit), a memory and the like. The PCU 18A is connected to the later-described MCU 22.

The DC buses 17A, 17B are paired at a positive electrode side and at a negative electrode side, and, for example, a DC voltage of approximately several hundreds V is applied thereto. At the power generation time of the assist power generation motor 15, the first inverter 16 converts AC power from the assist power generation motor 15 into DC power, which is supplied to the electricity storage device 19 and the revolving electric motor 20. At the power running time of the assist power generation motor 15, the first inverter 16 converts the DC power of the DC buses 17A, 17B into AC power, which is supplied to the assist power generation motor 15. In this case, the PCU 18A controls an on/off operation of each of the switching elements in the first inverter 16 based upon a motor generator output instruction from the MCU 22 or the like. As a result, the PCU 18A controls the generating power (regenerative power) at the power generation time and the drive power at the power running time of the assist power generation motor 15.

The electricity storage device 19 is connected to the DC buses 17A, 17B. That is, the electricity storage device 19 is connected electrically via the DC buses 17A, 17B to the assist power generation motor 15 and the revolving electric motor 20. The electricity storage device 19 is configured by, for example, an assembled battery (a lithium-ion battery unit) by electrically connecting a plurality of lithium-ion battery cells 19A, 19A in series and in parallel, or in series or in parallel. More specifically, an electricity storage main body of the electricity storage device 19 is configured by connecting a plurality of assembled batteries each formed by combining the plurality of lithium-ion battery cells 19A, 19A. In this case, the electricity storage device 19 includes the plurality of lithium-ion battery cells 19A, 19A, a battery control unit 19B, and a relay circuit (unillustrated).

The electricity storage device 19 stores therein the generating power by the assist power generation motor 15 or supplies the stored power to the assist power generation motor 15. That is, the electricity storage device 19 stores therein the power supplied from the assist power generation motor 15 at the power generation time of the assist power generation motor 15, and supplies the drive power to the assist power generation motor 15 at the power running time (at the assist drive time) of the assist power generation motor 15. In addition, the electricity storage device 19 stores therein the regenerative power supplied from the revolving electric motor 20 at the regeneration time of the revolving electric motor 20 and supplies the drive power to the revolving electric motor 20 at the power running time of the revolving electric motor 20.

In this way, the electricity storage device 19 stores therein the power generated by the assist power generation motor 15 and the regenerative power generated by the revolving electric motor 20 at the revolution braking time of the hydraulic excavator 1. In this case, the electricity storage device 19 is controlled by the battery control unit 19B (hereinafter, referred to as "BCU 19B"). That is, the BCU 19B is an engine controller (control device) for electricity storage device that monitors and controls the state of the electricity storage device 19. The BCU 19B is configured of, for example, a microcomputer and the like, and is provided with a CPU (central processor unit), a memory and the like. The BCU 19B is connected to the later-mentioned MCU 22.

Current, voltages and temperatures of the electricity storage device 19 are inputted to the BCU 19B. Therefore, for example, the electricity storage device 19 is provided therein with a current sensor, a voltage sensor, a temperature sensor and the like (none of them is illustrated). The current sensor, the voltage sensor and the temperature sensor are connected to the BCU 19B. The BCU 19B executes predetermined calculation processing based upon the current, the voltage and the temperature detected by the current sensor, the voltage sensor and the temperature sensor to perform the state determination, the calculation and the control of the electricity storage device 19.

For example, the BCU 19B calculates power dischargeable from the electricity storage device 19 as battery discharge power based upon the current and the voltage. Likewise, the BCU 19B calculates power chargeable to the electricity storage device 19 as battery charge power. The BCU 19B outputs a battery charging rate (SOC), battery discharge power, battery charge power and the like to the MCU 22. In addition to it, the BCU 19B monitors and estimates the state of the electricity storage device 19, based upon the voltage, the current, the temperature, the state of charge (SOC), a state of health (SOH) and the like. The BCU 19B, for example, in a case where any index of these elements deviates or is likely to deviate from an appropriate use range, transmits a signal to the MCU 22 to issue warning of being abnormal. The MCU 22 can control a charge operation and a discharge operation of the electricity storage device 19 based upon the information from the BCU 19B.

The revolving electric motor 20 as a revolving electric motor is driven by the power from the assist power generation motor 15 or the electricity storage device 19. The revolving electric motor 20 is configured of, for example, a three-phase induction motor, and is disposed on the revolving frame 6 together with the revolving hydraulic motor 3A. The revolving electric motor 20 drives the revolving device 3 in cooperation with the revolving hydraulic motor 3A. That is, the revolving device 3 is driven by the compound torque of the revolving hydraulic motor 3A and the revolving electric motor 20 to drive and revolve the upper revolving structure 4.

The revolving electric motor 20 is connected to the DC buses 17A, 17B through the second inverter 21. The revolving electric motor 20 plays two roles of a power running operation of being driven/rotated by receiving the power from the electricity storage device 19 or the assist power generation motor 15, and regeneration of generating power with extra torque at the revolving braking time and storing the generated power in the electricity storage device 19. Therefore, the power from the assist power generation motor 15 and the like is supplied through the DC buses 17A, 17B to the revolving electric motor 20 at the power running time. Thereby, the revolving electric motor 20 generates rotational torque in response to an operation of the operation device by an operator to assist in a drive of the revolving hydraulic motor 3A to cause the upper revolving structure 4 to be driven.

The second inverter 21 is, as similar to the first inverter 16, configured using a plurality of switching elements. An on/off operation of each of the switching elements in the second inverter 21 also is controlled by the PCU 18A. At the power running time of the revolving electric motor 20, the second inverter 21 converts the DC power of the DC buses 17A, 17B into AC power, which will be supplied to the revolving electric motor 20. At the regeneration time of the revolving electric motor 20, the second inverter 21 converts the AC power from the revolving electric motor 20 into DC power, which will be supplied to the electricity storage device 19 and the like. In this case, the PCU 18A controls the on/off operation of each of the switching elements in the second inverter 21 based upon a revolving electric generator output instruction from the MCU 22 or the like. As a result, the PCU 18A controls generating power at the regeneration time and drive power at the power running time of the revolving electric motor 20.

The MCU 22 is a vehicle body control controller configured to control the operation of the hydraulic excavator 1. The MCU 22 is connected, for example, to the ECU 11A, the PCU 18A, the BCU 19B and a later-described communication controller 24A (hereinafter, referred to as "CC24A") via a vehicle-on network 23 called a CAN (Controller Area Network) to be capable of communicating with each other. The MCU 22 is a controller positioned before the ECU 11A, the PCU 18A, the BCU 19B and CC24A. The MCU 22 is composed of, for example, a microcomputer and the like, and is provided with a CPU (central processor unit), a memory and the like.

The MCU 22 transmits various kinds of control signals (instruction signals) to the ECU 11A, the PCU 18A and BCU 19B based upon a lever operation amount, a pedal operation amount of an operator, a rotational speed of the engine 11, the state of charge (SOC) of the electricity storage device 19 and the like, for example. Thereby, the MCU 22 makes communications with the ECU 11A, the PCU 18A and BCU 19B to control the engine 11, the assist power generation motor 15, the revolving electric motor 20 and the electricity storage device 19. In addition, the MCU 22 makes communications with the CC24A as needed to control the later-described communication device 24, in this way, the MCU 22 integrally controls various kinds of equipment devices (the engine 11, the assist power generation motor 15, the revolving electric motor 20, the electricity storage device 19, the communication device 24 and the like) mounted on the hydraulic excavator 1.

The communication device 24 performs transmission and reception of information (data) via wireless communication to and from the management server 52 disposed in a position away from the hydraulic excavator 1. The communication device 24 is provided with the CC24A and the communication antenna 24B. The CC24A is a controller (control device) of the communication device 24. The CC24A is composed of, for example, a microcomputer and the like, and is provided with a CPU (central processor unit), a memory and the like. The CC24A is connected to the MCU 22.

Here, the MCU 22 collects (obtains) the operating information of the hydraulic excavator 1, for example. That is, the MCU 22 aggregates the operating data of the hydraulic excavator 1. For example, various pieces of operating information (operating data) of the rotational speed of the engine 11, pressures of the hydraulic actuators (for example, the cylinders 5D, 5E, 5F in the working mechanism 5, the revolving hydraulic motor 3A in the revolving device 3, and the traveling hydraulic motors 2B, 2C), the pressure of the hydraulic pump 12, the operation amount of the operation device, the oil temperature of the hydraulic oil and the like are inputted to the MCU 22 from various kinds of sensors connected to the ECU 11A, the PCU 18A, the BCU 19B and the MCU 22. The MCU 22 stores the inputted various pieces of the information (data) in the memory to correspond to time and date, for example.

The MCU 22 transmits the collected information (the operating information stored in the memory) via the communication device 24 to the management server 52 as the operating data at the end of operation of the hydraulic excavator 1, for example. In this case, for example, the CC24A in the communication device 24 transmits (outputs) the information collected by the MCU 22 together with machine body information (information for identifying a machine body, such as a model, a model code, a serial number, an identification number and the like) of the hydraulic excavator 1 to the management server 52 in the management center 51. The transmitted information is stored in a storage device 52A in the management server 52. The information of the hydraulic excavator 1 stored in the management server 52 can be read out via the communication line 53 by the information terminals 54, 55. That is, the operating state of the hydraulic excavator 1 can be confirmed by using the information terminals 54, 55.

Next, an operation of the hydraulic excavator 1 will be explained.

When an operator who has got in the cab 7 activates the engine 11, the hydraulic pump 12 and the assist power generation motor 15 are driven by the engine 11. Thereby, the pressurized oil delivered from the hydraulic pump 12 is delivered to the traveling hydraulic motors 2B, 2C, the revolving hydraulic motor 3A, and the boom cylinder 5D, the arm cylinder 5E and the bucket cylinder 5F in the working mechanism 5 in response to the lever operation and the pedal operation of the operation devices (the traveling lever/pedal operation device and the working lever operation device) disposed within the cab 7. Thereby, the hydraulic excavator 1 can perform the traveling operation by the lower traveling structure 2, the revolving operation of the upper revolving structure 4, the excavating operation by the working mechanism 5, and the like.

Here, for example, when the output torque of the engine 11 is larger than the drive torque of the hydraulic pump 12 at the operation time of the hydraulic excavator 1, the assist power generation motor 15 is driven as an electric generator by the extra torque. Thereby, the assist power generation motor 15 generates AC power, and the AC power is converted into DC power by the first inverter 16, which is stored in the electricity storage device 19. Meanwhile, when the output torque of the engine 11 is smaller than the drive torque of the hydraulic pump 12, the assist power generation motor 15 is driven as an electric motor by the power from electricity storage device 19, which assists in a drive of the engine 11.

Incidentally, the lithium-ion battery configuring the electricity storage device 19 is required to be managed to prevent a state of the overcharge or over discharge in view of securement of safety or suppression of performance degradation. On the other hand, the electricity storage device 19 is configured as the assembled battery in which the plurality of lithium-ion battery cells 19A, 19A are connected. Here, for example, it is assumed that charge and discharge are performed while managing an average charge remaining amount of the connected battery cells 19A, 19A. However, even when the charge and discharge are performed while managing the average charge remaining amount, there is a possibility that the overcharge (or the over discharge) occurs in a specific battery cell 19A having a high (or a low) voltage, for example.

Therefore, in the embodiment, the electricity storage device 19 is configured to be managed by monitoring not only the average charge remaining amount of the battery cells 19A, 19A configuring the electricity storage device 19 but also the maximum cell voltage and the minimum cell voltage of all the battery cells 19A, 19A and performing the restriction on the charge or the discharge and the balancing of the respective voltages (cell voltages) of the battery cells 19A, 19A as needed. On the other hand, when the state of causing the hydraulic excavator 1 not to operate lasts for a long period of time, that is, when the hydraulic excavator 1 is rested for a long period of time, the difference (cell voltage difference) between the maximum cell voltage and the minimum cell voltage of the battery cells 19A, 19A becomes possibly large. In this case, that is, in a case where the cell voltage difference becomes large, it is required to restrict use of the electricity storage device 19 to suppress the overcharge (or the over discharge). However, when the use of the electricity storage device 19 is restricted, for example, in a case of the hybrid hydraulic excavator 1, the hydraulic excavator 1 results in operating with a power source of the engine 11 only, restricting the operation.

Therefore, in the embodiment, the management server 52 estimates the cell voltage difference (the maximum cell voltage, the minimum cell voltage) with good accuracy during the non-operating time of the hydraulic excavator 1, making it possible to confirm the state of the electricity storage device 19. Therefore, it is possible to suppress the operation of the hydraulic excavator 1 from being restricted after the long-term vehicle rest. Hereinafter, this point will be in detail explained.

That is, in the embodiment, the electricity storage device 19 is provided with the plurality of assembled batteries configured by combining the plurality of lithium-ion battery cells 19A, 19A. In addition, the electricity storage device 19 is provided with a balancing discharge circuit (unillustrated) in addition to the plurality of battery cells 19A, 19A and the BCU 19B. The BCU 19B monitors the voltage state of each of the battery cells 19A, 19A to prevent the battery cells 19A, 19A from being overcharged or over discharged at the operating of the hydraulic excavator 1. Here, when the voltage difference between the respective battery cells 19A, 19A, that is, the difference (cell voltage difference) between the maximum value (maximum cell voltage) and the minimum value (minimum cell voltage) of the respective voltages (cell voltages) of the plurality of battery cells 19A, 19A becomes large, the overcharge or over discharge tends to easily occur.

Therefore, the BCU 19B balances the voltage differences (cell voltage differences) of the battery cells 19A, 19A by discharging the battery cell 19A having a high voltage using the balancing discharge circuit in parallel to the normal operation. In addition, the BCU 19B prohibits the charge and discharge of the electricity storage device 19 in a case where the voltage difference of the battery cells 19A, 19A becomes large to be more than a constant voltage difference. In this case, the hydraulic excavator 1 transfers to a degenerate operation mode in which the hydraulic excavator 1 operates with the engine 11 only as the power source.

On the other hand, the MCU 22 collects the state information and the warning information of each of equipment devices (for example, the engine 11, the inverter unit 18, and the electricity storage device 19) reported by each of the controllers (ECU 11A, PCU 18A and BCU 19B). The MCU 22 transmits these pieces of information as the operating data via the communication device 24 to the management server 52 at the end of operation of the hydraulic excavator 1. This operating data includes an operation start time Tst and an operation end time Ted of the hydraulic excavator 1, and battery state information such as a maximum voltage Vstmax and a minimum voltage Vstmin at the start of operation of the respective voltages of the battery cells 19A, 19A configuring the electricity storage device 19, a maximum voltage Vedmax and a minimum voltage Vedmin at the end of operation, and the like.

Next, an explanation will be made of the management server 52 with reference to FIG. 3 together with FIG. 1.

The management server 52 is disposed in a place away from the hydraulic excavator 1. The management server 52 is configured of a server computer, for example. The management server 52 receives the information (operating data) of the hydraulic excavator 1 transmitted via the wireless communication from the communication device 24 in the hydraulic excavator 1 to grasp, monitor and manage the state of the hydraulic excavator 1. The management server 52 is configured of, for example, a server computer, a host computer, a main frame, and a large-sized computer such as a general-purpose computer. The management server 52 stores the information (operating data) outputted (transmitted) from the hydraulic excavator 1 as the information for each of the hydraulic excavators 1.

Therefore, the management server 52 is provided with the storage device 52A that is composed of a large-capacity storage medium such as an HDD (hard disc drive) and forms data base. The storage device 52A stores (stores, saves and registers) the operating information of the hydraulic excavator 1. Further, a processing program for executing a processing flow illustrated in a FIG. 4 as described later, that is, a processing program to be used for management of the electricity storage device 19 in the hydraulic excavator 1 is in advance stored in the storage device 52A.

Figure 3:
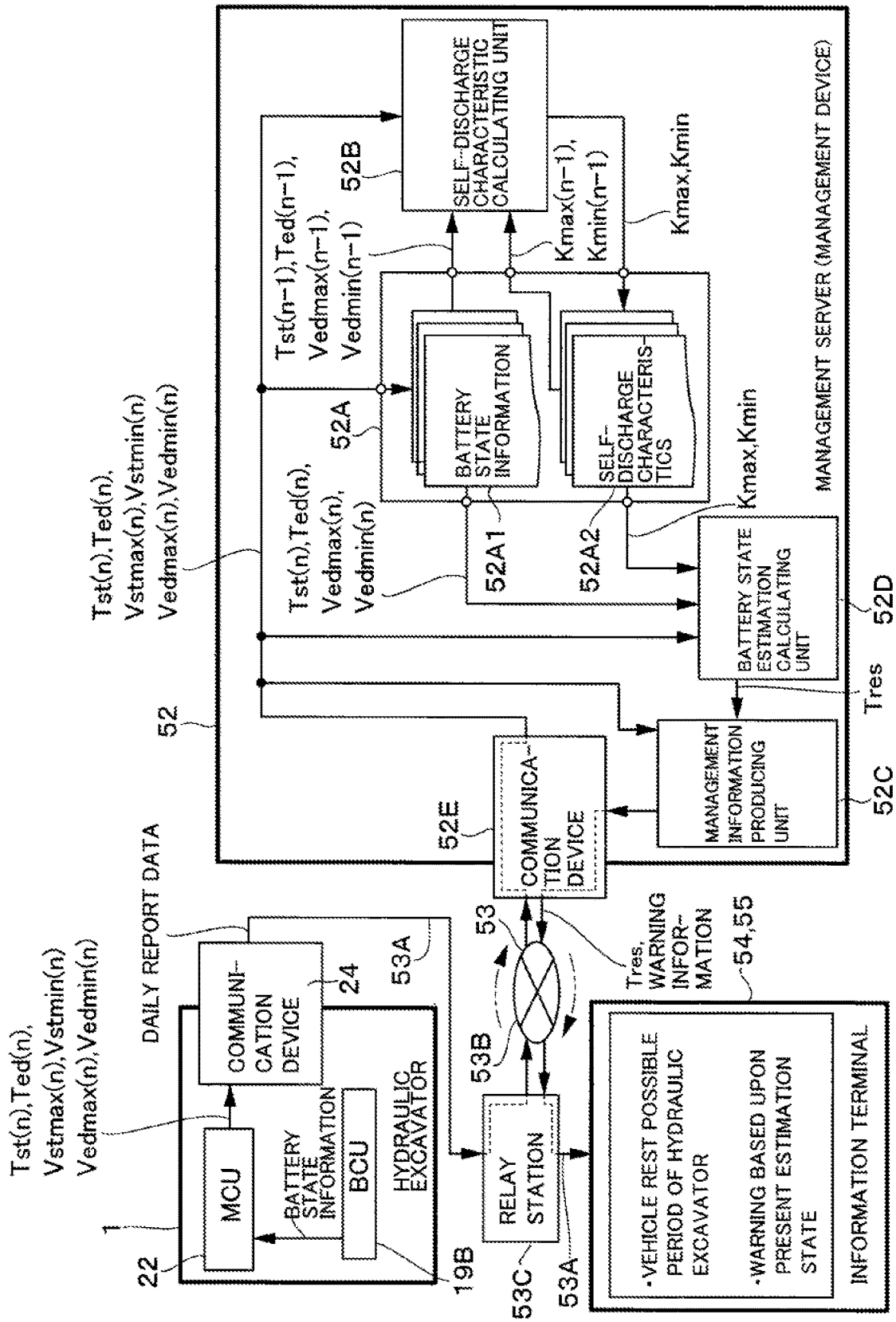
FIG. 3 is a block diagram of the hydraulic excavator and the management device in FIG. 1.

As illustrated in FIG. 3, the management server 52 includes the storage device 52A, a self-discharge characteristic calculating unit 52B as a calculation function, a management information producing unit 52C, a battery state estimation calculating unit 52D as estimation means and a calculation function, and a communication device 52E. Battery state information 52A1 contained in the operating data received from the hydraulic excavator 1, that is, Tst, Ted, Vstmax, Vstmin, Vedmax, and Vedmin is recorded (stored) in the storage device 52A in the management server 52.

That is, the operation start time Tst, the operation end time Ted, the maximum voltage Vstmax at the start of operation, the minimum voltage Vstmin at the start of operation, the maximum voltage Vedmax at the end of operation and the minimum voltage Vedmin at the end of operation are recorded in the storage device 52A as the battery state information 52A1. In the subsequent explanation, the battery state information at the reception of the operating data in the $n^{th}$ number of times is noted as Tst (n), Ted (n), Vstmax (n), Vstmin (n), Vedmax (n), and Vedmin (n). In addition, a maximum cell voltage drop amount and a minimum cell voltage drop amount as the discharge characteristics of the electricity storage device 19 to be used at the time of estimating the battery state are also recorded as self-discharge characteristics in the storage device 52A. That is, the storage device 52A corresponds to a battery cell state storing unit in which the battery state information 52A1 is stored and corresponds to a discharge characteristic storing unit in which the self-discharge characteristics 52A2 are stored.

The management server 52 performs calculations by the various kinds of calculation functions, for example, at 24 o'clock (24:00) every day, in other words, at 0 o'clock in the morning (0:00 AM). In this case, the self-discharge characteristic calculating unit 52B calculates, when the operating data is received on that day, the maximum cell voltage drop amount and the minimum cell voltage drop amount based upon the received operating data, the past operating data recorded in the storage device 52A, and the maximum cell voltage drop amount and the minimum cell voltage drop amount that are recorded in the storage device 52A and were calculated initially or in the past. The self-discharge characteristic calculating unit 52B corresponds to a discharge characteristic updating unit that updates the discharge characteristics.

The following Formula 1 is a calculation formula of the maximum cell voltage drop amount Kmax (n) at the reception of the operating data of the $n^{th}$ number of times. The maximum cell voltage drop amount Kmax (n) is found by dividing a difference (reduction amount) between the minimum voltage at the end of operation of the $(n-1)^{th}$ number of times and the minimum voltage at the start of operation of the $n^{th}$ number of times by time (the number of days) from the end of operation of the $(n-1)^{th}$ number of times to the start of operation of the $n^{th}$ number of times. That is, the maximum cell voltage drop amount Kmax (n) corresponds to a maximum cell voltage drop amount (voltage changing amount) per day.

$$Kmax(n) = \frac{Vstmin(n) - Vedmin(n-1)}{Tst(n) - Ted(n-1)} \quad \text{[Formula 1]}$$

The following Formula 2 is a calculation formula of the minimum cell voltage drop amount Kmin (n) at the reception of the operating data of the $n^{th}$ number of times. The minimum cell voltage drop amount Kmin (n) is found by dividing a difference (reduction amount) between the maximum voltage at the end of operation of the $(n-1)^{th}$ number of times and the maximum voltage at the start of operation of the $n^{th}$ number of times by time (the day number) from the end of operation of the $(n-1)^{th}$ number of times to the start of operation of the $n^{th}$ number of times. That is, the minimum cell voltage drop amount Kmin (n) corresponds to a minimum cell voltage drop amount (voltage changing amount) per day.

$$Kmin(n) = \frac{Vstmax(n) - Vedmax(n-1)}{Tst(n) - Ted(n-1)} \quad \text{[Formula 2]}$$

The estimation of the battery state, that is, the maximum cell voltage drop amount Kmax and the minimum cell voltage drop amount Kmin in use for the calculation of the estimation maximum value and the estimation minimum value of the cell voltage are calculated using the following Formula 3 and Formula 4. In this case, the maximum cell voltage drop amount Kmax and the minimum cell voltage drop amount Kmin in use for the estimation are calculated using a weighted average to the voltage drop amounts from the second number of times to the $n^{th}$ number of times which are calculated using the Formula 1 and Formula 2 and to the initial voltage drop amount. Here, the initial maximum cell voltage drop amount is indicated at Kmax (0), the initial minimum cell voltage drop amount is indicated at Kmin (0), and a weight of the weighted average to the initial voltage drop amount is indicated at L0. The weight of the voltage drop amount based upon the daily report data of each is defined as a length of a non-operating period of the data. L0 is a large value in use in a case of focusing on the initial value and is a small value in use in a case of focusing on the data at the operating time.

$$Kmax = \frac{Kmax(0)L0 + Kmax(2)(Tst(2) - Ted(1)) + \cdots + Kmax(n)(Tst(n) - Ted(n-1))}{L0 + (Tst(n) - Ted(1))} \quad \text{[Formula 3]}$$

$$Kmax = \frac{Kmax(0)L0 + Kmax(2)(Tst(2) - Ted(1)) + \cdots + Kmax(n)(Tst(n) - Ted(n-1))}{L0 + (Tst(n) - Ted(1))} \quad \text{[Formula 4]}$$

Kmax calculated using Formula 3 and Kmin calculated using Formula 4 are recorded as the maximum cell voltage drop amount and the minimum cell voltage drop amount in use for the estimation of the battery state in the storage device 52A. That is, the maximum cell voltage drop amount Kmax and the minimum cell voltage drop amount Kmin are stored as the self-discharge characteristics 52A2 in the storage device 52A. Here, the calculation and the recording of the self-discharge characteristics 52A2, and the recording of the battery state information 52A1 are managed for each of the electricity storage devices 19. That is, the voltage drop amount per hour differs upon a manufacture variation for each of the battery cells 19A, 19A, and a difference between the voltage drop amount of the battery cell 19A the maximum voltage drop of which is the largest and the voltage drop amount of the battery cell 19A the minimum voltage drop of which is the smallest is determined by a combination of the battery cells 19A, 19A to be used at the manufacture.

Therefore, the data at the operating time is collected and the calculation is made based upon this collection, thus executing the update to the self-discharge characteristics 52A2 optimal for each of the electricity storage devices 19. At this time, in a case of receiving the operating data at the initial time, the update to the self-discharge characteristics 52A2 is not executed. In addition, in the initial case where the self-discharge characteristics 52A2 is not updated once, the maximum cell voltage drop amount and the minimum cell voltage drop amount that are set from a specification value of the battery cell 19A and the manufacture variation at the initial production time are recorded in the storage device 52A. In this case, the maximum cell voltage drop amount can be set as the maximum cell voltage drop amount that is the largest in a range of the variation, for example. In addition, the minimum cell voltage drop amount can be set as the minimum cell voltage drop amount that is the smallest in a range of the variation, for example.

In the battery state estimation calculating unit 52D, first, the estimation of the battery state is made on the day there is no reception of the operating data (daily report data) for the estimation of the battery state, and after that, the vehicle rest possible period is calculated. That is, the battery state estimation calculating unit 52D corresponds to the battery cell state calculating unit that makes the estimation of the battery state (calculation of the estimation maximum value and the estimation minimum value in the cell voltage) and also corresponds to the vehicle rest possible period calculating unit that calculates the vehicle rest possible period of the hydraulic excavator. In the estimation of the battery state, the estimation of the battery state is made based upon the latest maximum cell voltage drop amount Kmax and the latest minimum cell voltage drop amount Kmin stored in the storage device 52A, and the maximum voltage Vedmax (t0) and the minimum voltage Vedmin (t0) of the battery cell 19A at the end of operation contained in the operating data at time t0 when the operating data is finally received. A maximum value Vmax (t) and a minimum value Vmin (t) of the cell voltage estimated at the present time t are calculated using Formula 5 and Formula 6 as follows.

$$V\max(t) = Ved\max(t0) + K\min(t - t0) \quad \text{[Formula 5]}$$

$$V\min(t) = Ved\min(t0) + K\max(t - t0) \quad \text{[Formula 6]}$$

In the calculation of the vehicle rest possible period, the vehicle rest possible period is calculated based upon the maximum voltage Vedmax (n) and the minimum voltage Vedmin (n) of the battery cell 19A extracted from the operating data received at the last $n^{th}$ number of times or the maximum voltage Vmax (t) and the minimum voltage Vmin (t) of the battery cell 19A at time t estimated. Here, a threshold value of the voltage difference between the maximum voltage and the minimum voltage of the battery cell 19A in the degenerate operation mode of the hydraulic excavator 1 by restricting the charge and discharge of the electricity storage device 19 is indicated at Vref. In this case, a period until the present voltage difference of the battery cell 19A reaches this threshold value Vref becomes a vehicle rest possible period Tres. In a case of receiving the daily report data (operating data), the vehicle rest possible period Tres is calculated by Formula 7 as follows. In a case of not receiving the daily report data, the vehicle rest possible period Tres is calculated by Formula 8 as follows.

$$Tres = \frac{Vref - (Vedmax(n) - Vedmin(n))}{Kmax - Kmin} \quad \text{[Formula 7]}$$

$$Tres = \frac{Vref - (Vmax(t) - Vmin(t))}{Lmax - Kmin} \quad \text{[Formula 8]}$$

The management information producing unit 52C corresponds to an output unit that outputs the information (more specifically, the vehicle rest possible period Tres) based upon the estimated battery state (the estimation maximum value and the estimation minimum value of the cell voltage). That is, in the management information producing unit 52C, the vehicle rest possible period Tres of the hydraulic excavator 1 is processed to be Web data. Specifically, the vehicle rest possible period Tres is processed to a state of being capable of being browsed via the Internet line 53B from the information terminals 54, 55 of the manager in the hydraulic excavator 1. In this case, the management information producing unit 52C may process, for example, the vehicle rest possible period Tres to a data report (report document) of a list together with the operating data stored in the storage device 52A or to maintenance information concerning a maintenance time of the hydraulic excavator 1.

When a manager accesses the management server 52 by using the Web browser function of the information terminals 54, 55, the management information producing unit 52C outputs the information (vehicle rest possible period Tres) of the battery state via the communication device 52E to the information terminals 54, 55. As a result, the information (vehicle rest possible period Tres) of the battery state is displayed on the information terminals 54, 55. In addition, the management information producing unit 52C determines whether or not the vehicle rest possible period is not equal to or more than a predetermined period (threshold value). In a case where the vehicle rest possible period is determined to be not equal to or more than the predetermined period (threshold value), the management information producing unit 52C produces a measurement method in which it is described that the warning information and the balancing of the voltages of the battery cells are necessary.

The management information producing unit 52C issues (outputs) the warning information and the measurement method (for example, an instruction of the maintenance operation) to the information terminals 54, 55 of the manager in the hydraulic excavator 1. In this case, the management server 52 (management information producing unit 52C) can output, for example, the warning information and the measure method by email transmission. In addition, the threshold value (predetermined period) of the vehicle rest possible period is set as a period in which the measure can be taken by the time the vehicle rest possible period Tres becomes 0. That is, the threshold value of the vehicle rest possible period is set as a sufficient allowance period for which the measure can be taken by the time the voltage difference (cell voltage difference) of the battery cell 19A becomes equal to or more than the constant threshold value Vref to restrict the charge and discharge of the electricity storage device 19 (the hydraulic excavator 1 becomes in the degenerate operation mode).

Figure 4:
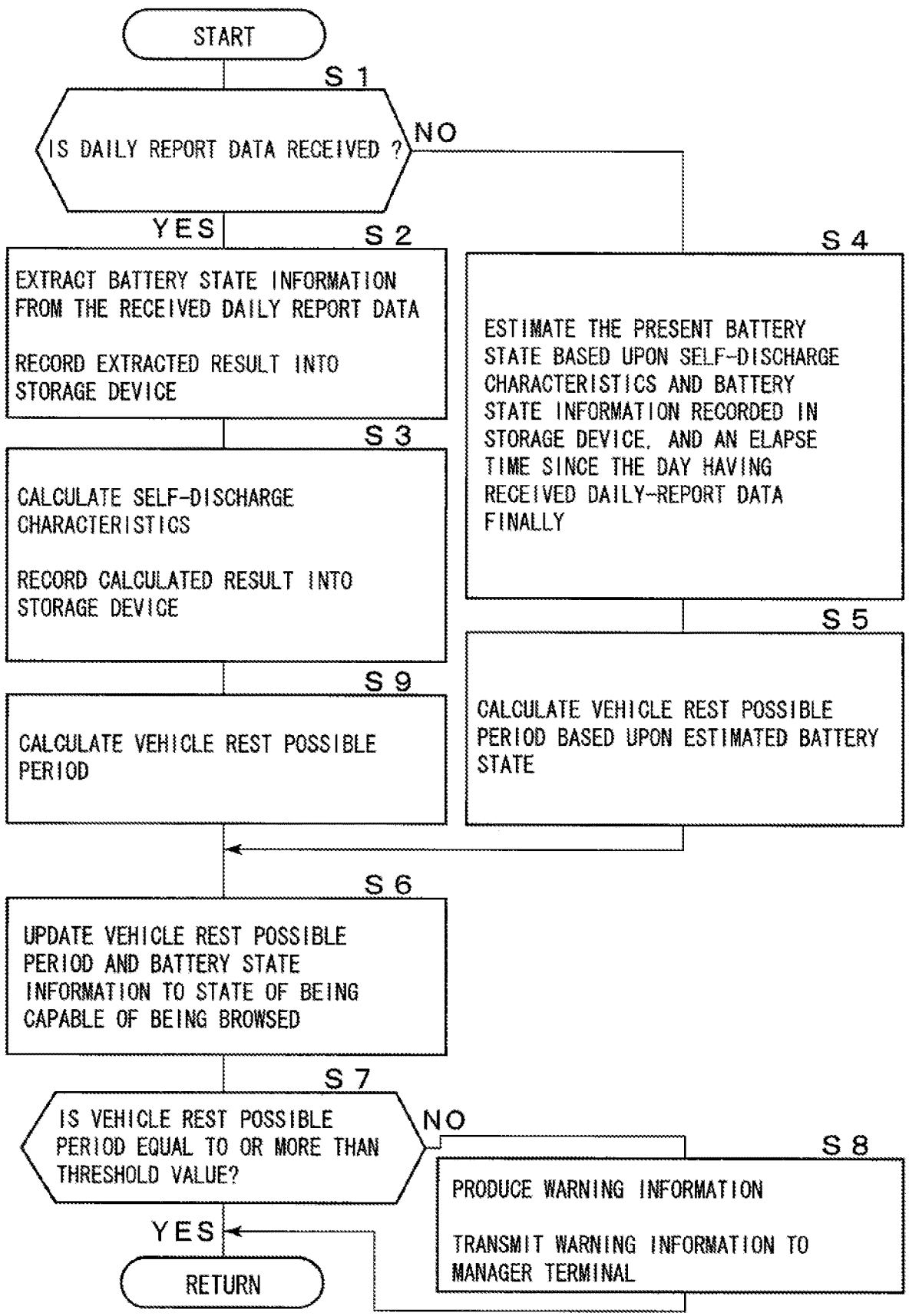
FIG. 4 is a flow chart illustrating control processing to be executed in a management server (the management device) in FIG. 1.

Next an explanation will be made of the control processing (operation flow) to be executed in the management server 52 with reference to FIG. 4. It should be noted that the control processing in FIG. 4 is executed in a predetermined time, for example, at the end of that day every day. In the embodiment, the control processing is executed at 24 o'clock (0:00 AM), for example.

The management server 52 starts the processing in FIG. 4 when it comes to a predetermined time (for example, 24 o'clock). At S1, it is determined (confirmed) whether or not the daily report data (operating data) is received from the hydraulic excavator 1 on that day (that is, from 0:00 to 24:00). In a case where at S1, "NO" is determined, that is, the daily report data is determined to be not received, the process goes to S4. On the other hand, in a case where at S1, "YES" is determined, that is, the daily report data is determined to be received, the process goes to S2.

At S2, the battery state information containing the maximum voltage and the minimum voltage of the battery cell 19A is extracted from the received daily report data, and the extracted battery information is recorded in the storage device 52A. At S3 subsequent to S2, new self-discharge characteristics are calculated in the self-discharge characteristic calculating unit 52B based upon the maximum voltage and the minimum voltage of the battery cell 19A recorded in the storage device 52A on that day and in the past. That is, among the respective battery cells 19A, 19A, a voltage drop amount of the battery cell 19A the voltage drop of which is the largest per hour and a voltage drop amount of the battery cell 19A the voltage drop of which is the smallest per hour are calculated, which are defined as new self-discharge characteristics. In addition, the self-discharge characteristics as the calculation result are recorded in the storage device 52A to update the self-discharge characteristics. At S9 subsequent S3, the vehicle rest possible period is calculated in the battery state estimation calculating unit 52D based upon the maximum voltage and the minimum voltage of the battery cell 19A contained in the battery state information of the received daily report data. When at S9 the vehicle rest possible period is calculated, the process goes to S6.

On the other hand, at S4 the maximum voltage and the minimum voltage (battery state) of the battery cell 19A at the present are calculated in the battery state estimation calculating unit 52D based upon "the self-discharge characteristics recorded in the storage device 52A", "the maximum voltage and the minimum voltage (battery state information) of the battery cell in the daily report data that is recorded in the storage device 52A and is received finally" and "a time elapsed after the daily report data is finally received". Based upon this, the maximum voltage and the minimum voltage of the battery cell 19A (the battery state) are estimated. At S5 subsequent S4, the vehicle rest possible period of the hydraulic excavator 1 is calculated in the battery state estimation calculating unit 52D based upon the maximum voltage and the minimum voltage of the battery cell at the present (the battery state) estimated at S4. When at S5 the vehicle rest possible period is calculated, the process goes to S6.

At S6, the state information (the vehicle rest possible period and the battery state information) of the hydraulic excavator 1 that the manager of the hydraulic excavator 1 browses by using the information terminals 54, 55 is updated in the management information producing unit 52C. At subsequent S7, it is determined whether or not the vehicle rest possible period of the hydraulic excavator is equal to or more than a constant period (threshold value). In a case where at S7 "NO" is determined, that is, the vehicle rest possible period is determined to be shorter than the threshold value, the process goes to S8. At S8, the warning information is produced in the management information producing unit 52C, and the warning information is transmitted to the information terminals 54, 55 of the manager in the hydraulic excavator 1. When at S8 the warning information is transmitted, the process returns. On the other hand, in a case where at S7 "YES" is determined, the vehicle rest possible period is determined to be equal to or more than the threshold value, the process returns without via S8.

As described above, the hydraulic excavator 1 transmits the self-state information (daily report data) containing the battery state information of the electricity storage device 19 to the management server 52 at the end of operation. The management server 52 starts a series of operations (the control processing and the calculation processing) when it comes to 24 o'clock (0 o'clock). In this case, when the daily report data is received, the battery state information contained in the daily report data is extracted, which is saved in the storage device 52A. After that, the self-discharge characteristic calculating unit 52B calculates the self-discharge characteristics based upon the battery state information on that day and in the past recorded in the storage device 52A to update the self-discharge characteristics recorded in the storage device 52A to the calculation result. In addition, the vehicle rest possible period is calculated based upon the battery state information contained in the daily report data in the battery state estimation calculating unit 52D. In a case where the vehicle rest possible period is within the threshold value, the management information producing unit 52C produces the warning information, which is transmitted to the information terminals 54, 55 of the manager in the hydraulic excavator 1. In a case where the vehicle rest possible period is equal to or more than the threshold value, nothing is done (the warning information is not transmitted).

Here, in a state where the hydraulic excavator 1 is not operating, the daily report data (operating data) is not transmitted from the hydraulic excavator 1. On the day when the hydraulic excavator 1 is not operating, the management server 52 cannot receive the daily report data, and, when it comes to 24 o'clock (0 o'clock), calculates the present battery state information in the battery state estimation calculating unit 52D, based upon "the past battery state information saved (stored) in the storage device 52A", "the self-discharge characteristics saved (stored) in the storage device 52A", and "an elapse time since the day the daily report data is received finally". In addition, the battery state estimation calculating unit 52D calculates the vehicle rest possible period based upon the estimated battery state information. In a case where the vehicle rest possible period is within the threshold value, the management information producing unit 52C produces the warning information, which is transmitted to the information terminals 54, 55 of the manager in the hydraulic excavator 1. In a case where the vehicle rest possible period is equal to or more than the threshold value, nothing is done (the warning information is not transmitted).

In a case where the hydraulic excavator 1 continues to operate, since the self-discharge characteristics continue to update, the self-discharge characteristics are updated to be optimized peculiarly to the electricity storage device 19 mounted on the hydraulic excavator 1. As a result, the estimation accuracy of the battery state information improves. In addition, also in a case where the hydraulic excavator 1 does not operate for a long period of time, the estimation of the battery state is made in the management server 52 every day, and this information can be browsed from the information terminals 54, 55 to be used by the manager of the hydraulic excavator 1. In addition, in a case where the vehicle rest possible period becomes within a constant threshold value, the warning information is transmitted to the information terminals 54, 55 of the manager in the hydraulic excavator 1 from the management server 52.

In this way, the construction machine management system (electricity storage device management system) in the embodiment is provided with the management server 52 as a management device. The management server 52 is disposed in a position away from the hydraulic excavator 1 having the electricity storage device 19 and the communication device 24. The management server 52 receives the information of the electricity storage device 19 transmitted via the communication device 24 from the hydraulic excavator 1 to manage the electricity storage device 19. Here, in the embodiment, the information of the electricity storage device 19 is information including the maximum value (maximum cell voltage) and the minimum value (minimum cell voltage) of the respective voltages (cell voltages) of the plurality of battery cells 19A, 19A configuring the electricity storage device 19. It should be noted that the information of the electricity storage device 19 may use, in place of the maximum value and the minimum value of the cell voltage, for example, a state amount having a correlative relationship to the cell voltage, specifically, a maximum value (maximum cell charging rate) and a minimum value (minimum cell charging rate) of the respective charging rates (cell charging rates) of the plurality of battery cells 19A, 19A.

The management server 52 is provided with a battery cell state storing unit, a discharge characteristic storing unit, a battery cell state calculating unit, and an output unit. The battery cell state storing unit and the discharge characteristic storing unit correspond to the storage device 52A in the management server 52. The battery state information 52A1, that is, the maximum value and the minimum value of the cell voltage (or the cell charging rate) are stored in the storage device 52A (battery cell state storing unit). The self-discharge characteristics 52A2, that is, discharge characteristics of the electricity storage device 19 are stored in the storage device 52A (discharge characteristic storing unit).

The battery cell state calculating unit corresponds to the battery state estimation calculating unit 52D in the management server 52. The battery state estimation calculating unit 52D (battery cell state calculating unit) calculates an estimation maximum value and an estimation minimum value of the present or future cell voltage (or cell charging rate) by adding the discharge characteristics stored in the storage device 52A (discharge characteristic storing unit) to the maximum value and the minimum value of the latest cell voltage (or the latest cell charging rate) stored in the storage device 52A (battery cell state storing unit).

The output unit corresponds to the management information producing unit 52C (and the communication device 52E). The management information producing unit 52C and the communication device 52E (output unit) output information (for example, the vehicle rest possible period) based upon the estimation maximum value and the estimation minimum value of the cell voltage (or the cell charging rate) calculated in the battery state estimation calculating unit 52D (battery cell state calculating unit).

In the embodiment the management server 52 is further provided with a discharge characteristic updating unit. The discharge characteristic updating unit corresponds to the self-discharge characteristic calculating unit 52B in the management server 52. The self-discharge characteristic calculating unit 52B (discharge characteristic updating unit) updates the discharge characteristics based upon the maximum value and the minimum value of the past cell voltage (or the past cell charging rate) stored in the storage device 52A (battery cell state storing unit). The update discharge characteristics updated in the self-discharge characteristic calculating unit 52B is stored in the storage device 52A (discharge characteristic storing unit). The battery state estimation calculating unit 52D (battery cell state calculating unit) calculates an estimation maximum value and an estimation minimum value of the present or future cell voltage (or cell charging rate) by adding the update discharge characteristics stored in the storage device 52A (discharge characteristic storing unit) to the maximum value and the minimum value of the latest cell voltage (or the latest cell charging rate) stored in the storage device 52A (battery cell state storing unit).

In the embodiment, the maximum value and the minimum value of the cell voltage (or the cell charging rate) are stored in the storage device 52A (battery cell state storing unit) for each of the electricity storage devices 19. The discharge characteristics are stored in the storage device 52A (discharge characteristic storing unit) for each of the electricity storage devices 19.

In the embodiment the management server 52 is further provided with a vehicle rest possible period calculating unit. The vehicle rest possible period calculating unit corresponds to the battery state estimation calculating unit 52D in the management server 52. The battery state estimation calculating unit 52D (vehicle rest possible period calculating unit) calculates a vehicle rest possible period of the hydraulic excavator 1 that becomes a period until a restriction on use of the electricity storage device 19 starts, based upon the estimation maximum value and the estimation minimum value of the future cell voltage (or cell charging rate) calculated in the battery state estimation calculating unit 52D (battery cell state calculating unit). The management information producing unit 52C and the communication device 52E (output unit) output information of the vehicle rest possible period calculated in the battery state estimation calculating unit 52D (vehicle rest possible period calculating unit). In this case, the management information producing unit 52C and the communication device 52E (output unit) output the vehicle rest possible period calculated in the battery state estimation calculating unit 52D (vehicle rest possible period calculating unit) or the warning information based upon the vehicle rest possible period to the information terminals 54, 55 to be used by the manager of the hydraulic excavator 1.

Figure 5:
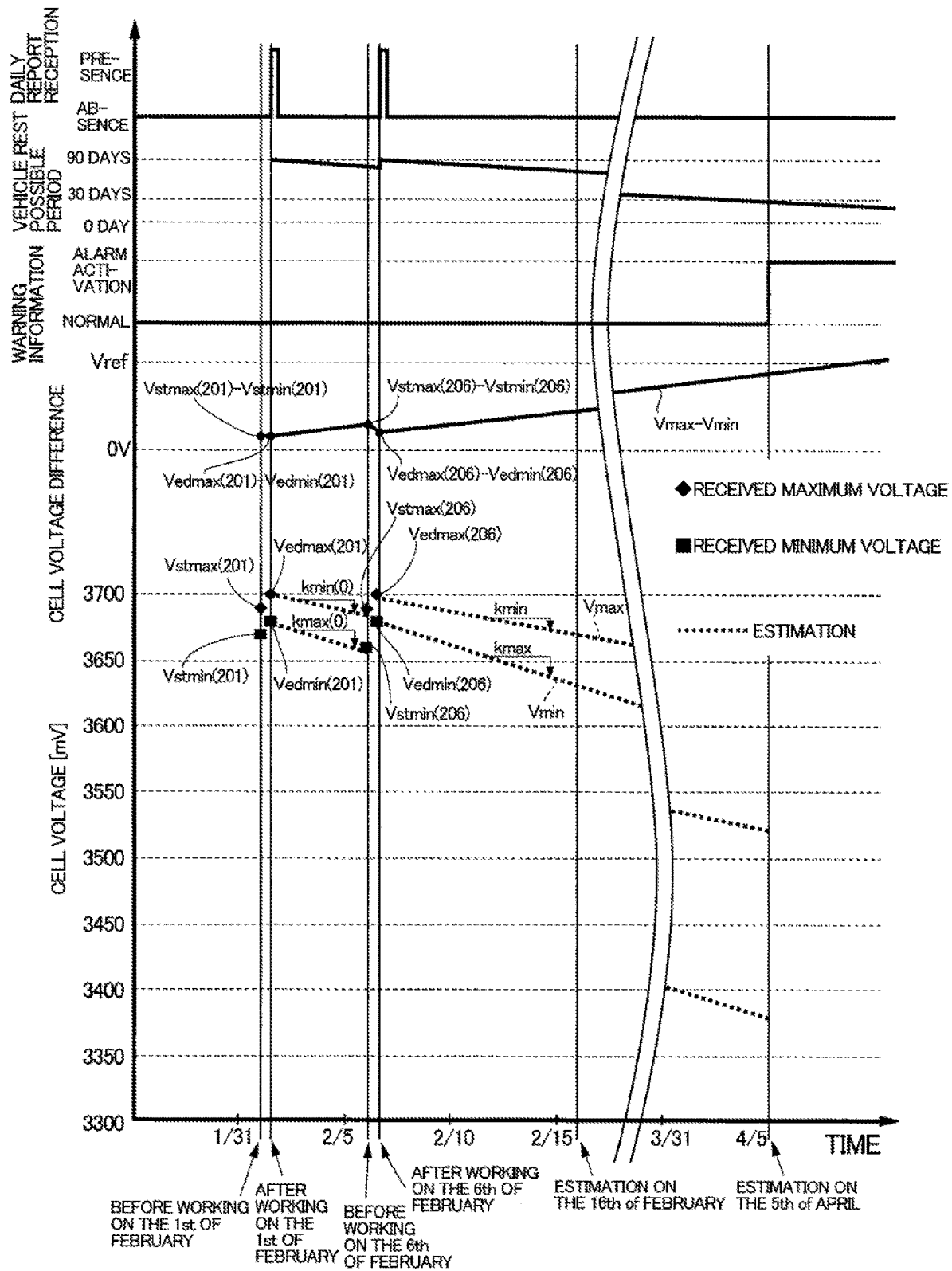
FIG. 5 is a characteristic line diagram illustrating an example of a change over time of a cell voltage and a cell voltage difference of an electricity storage device, warning information, a vehicle rest possible period and daily report reception.

The management server 52 according to the embodiment has the configuration as described above, and next, an operation thereof will be explained with reference to FIG. 5. FIG. 5 illustrates an example of a change over time of a cell voltage and a cell voltage difference of the electricity storage device 19, warning information, a vehicle rest possible period, and daily report reception.

First, an explanation will be made of the operation using an example on the sixth of February (2/6). Since the hydraulic excavator 1 operates on the sixth of February, the daily report data is transmitted to the management server 52 at the end of operation on the sixth of February. The management server 52 that has received the daily report data extracts "the data of the maximum voltage and the minimum voltage of the battery cell 19A at the start of operation" and "the data of the maximum voltage and the minimum voltage of the battery cell 19A at the end of operation" from the daily report data, which are recorded in the storage device 52A. The management server 52 starts the calculation by various kinds of functions when it comes to 24 o'clock (0 o'clock). First, the calculation of the self-discharge characteristics is made in the self-discharge characteristic calculating unit 52B. The hydraulic excavator 1 operates on the first of February (2/1) before the sixth of February, and the maximum voltage and the minimum voltage of the battery cell 19A extracted from the daily report data are recorded in the storage device 52A. After that, in the embodiment, the formula is expressed by putting three or four-digit number into an n-part in the formula as the months. In addition, the time is calculated by the day number.

The voltage drop amount on the sixth of February is calculated from Formula 1. In this case, the minimum voltage at the end of operation on the first of February is expressed as Vedmin (201)=3680 mV, and the minimum voltage at the start of operation on the sixth of February is expressed as Vstmin (206)=3660 mV. In addition, since T (206)−T (201)=five days, the voltage drop amount of the minimum voltage is expressed as Kmax (206)=−4 mV/day. Likewise, Formula 2 is used to calculate the voltage drop amount. In this case, the maximum voltage at the end of operation on the first of February is expressed as Vedmax (201)=3700 mV, and the maximum voltage at the start of operation on the sixth of February is expressed as Vstmax (206)=3690 mV. In addition, since T (206)−T (201)=five days, the voltage drop amount of the maximum voltage is expressed as Kmin (206)=−2 mV/day.

In the present example, the first of February is assumed as the day when the hydraulic excavator 1 operated for the first time. The voltage drop amount in use for estimation is calculated from Formula 3 and Formula 4. In this case, the initial voltage drop amount is expressed as Kmax (0)=−5 mV/day and Kmin (0)=−3 mV/day, and the weight is expressed as L0=100. Since there is no previous operating data on the first of February, the calculation of the self-discharge characteristics is not made. The weight of data for finding a weighted average is expressed based upon a length of the non-operating period, and the weight of the data on the sixth of February is expressed as five. As a result, Kmax=−4.95 mV/day by Formula 3 and Kmin=−2.95 mV/day by Formula 4, which are recorded in the storage device 52A.

Next, the management server 52 calculates the vehicle rest possible period based upon the difference between the maximum voltage and the minimum voltage of the battery cell 19A contained in the received daily report data. That is, the vehicle rest possible period is calculated from Formula 7. The maximum voltage at the end of operation on the sixth of February is expressed as Vedmax (206)=3700 mV, and the minimum voltage is expressed as Vedmim (206)=3680 mV. Here, in the present example, the threshold value of the voltage difference in the battery cells in which the hydraulic excavator 1 restricts the charge and discharge of the electricity storage device 19 to become in the degenerate operation mode is expressed as Vref=200 mV. Since the self-discharge characteristics recorded in the storage device 52A are expressed as Kmax=−4.95 mV/day and Kmin=−2.95 mV/day, Tres=90 days.

The management server 52 updates in the management information producing unit 52C the result of the vehicle rest possible period of 90 days to the state information of the hydraulic excavator 1 that the manager of the hydraulic excavator 1 browses by using the information terminals 54, 55. As a result, the manager of the hydraulic excavator 1 understands that the hydraulic excavator 1 can be stored without operating for at least 90 days. In addition, the management information producing unit 52C determines whether or not there is a period equal to or more than the threshold value to the vehicle rest possible period of 90 days. This threshold value is defined as 30 days in the present example. At the present point, since there is the vehicle rest possible period of 30 days or more, the management server 52 ends the operation on the sixth of February without doing anything (that is, with no transmission of the warning information).

Next, an explanation will be made of the operation using an example on the sixteenth of February (2/16). Since the hydraulic excavator 1 does not operate on the sixteenth of February, the daily report data is not transmitted. Therefore, the management server 52 makes the estimation of the battery state in the battery state estimation calculating unit 52D when it comes to 24 o'clock (0 o'clock). The day when the hydraulic excavator 1 previously operated is the sixth of February, and the battery state information at the end of operation on that day is recorded in the storage device 52A.

The maximum value of the cell voltage on the sixteenth of February is calculated from Formula 5. In this case, the battery state information on the sixth of February is expressed as Vedmax (206)=3700 mV. In addition, the latest self-discharge characteristics recorded in the storage device 52A are expressed as Kmin=−2.95 mV/day. An elapse time since the day when the daily report data was previously received is 10 days. Therefore, Vmax (216)=3670.5 mV. Likewise, the minimum value of the cell voltage on the sixteenth of February is calculated from Formula 6. In this case, the battery state information on the sixth of February is expressed as Vedmin (206)=3680 mV. In addition, the latest self-discharge characteristics recorded in the storage device 52A are expressed as Kmax=−4.95 mV/day. An elapse time since the day when the daily report data was previously received is 10 days. Therefore, Vmin (216)=3630.5 mV. The calculation results become estimation battery state information at a point on the sixteenth of February.

Next, the management server 52 calculates the vehicle rest possible period based upon the difference between the maximum voltage and the minimum voltage of the battery cell 19A in the estimation battery state information. That is, the vehicle rest possible period is calculated from Formula 8. In this case, since Vmin (216)=3630.5 mV, Vmax (216)=3670.5 mV, Kmax=−4.95 mV/day, Kmin=−2.95 mV/day, and Vref=200 mV, the vehicle rest possible period is expressed as Tres=80 days.

The management server 52 updates in the management information producing unit 52C the result of the vehicle rest possible period of 80 days to the state information of the hydraulic excavator 1 that the manager of the hydraulic excavator 1 browses by using the information terminals 54, 55. As a result, the manager of the hydraulic excavator 1 understands that the hydraulic excavator 1 can be stored without operating for at least 80 days, at a point of the sixteenth of February. In addition, the management information producing unit 52C determines whether or not there is a period equal to or more than the threshold value to the vehicle rest possible period of 80 days. Since there is the vehicle rest possible period of 30 days or more at a point of the sixteenth of February, the management server 52 ends the operation on the sixteenth of February without doing anything (that is, with no transmission of the warning information). From the second of February to the fifteenth of February, there is no operation of the hydraulic excavator, but the operation is made as similar to the example on the sixteenth of February. Assuming that the state where there is no operation of the hydraulic excavator 1 lasts until the fifth of April and that the estimation battery state on the sixth of April (4/6) is expressed as Vmin (405)=3378 mV and Vmax (405)=3520 mV, the vehicle rest possible period is expressed as Tres=29 days. At this time, the management information producing unit 52C produces the warning information because of no threshold value of 30 days or more and outputs the warning information to the information terminals 54, 55 of the manager in the hydraulic excavator 1.

In this way, even in a case where the state where the is no operation of the hydraulic excavator 1 lasts for a long period of time, the manager of the hydraulic excavator 1 can confirm the state of the battery cells 19A, 19A in the electricity storage device 19 and can receive the warning information. As a result, it is possible to take measures before use of the electricity storage device 19 is restricted to be in the degenerate operation mode. In addition, the estimation accuracy of the battery state information improves by collecting the information in the normal operating state of the hydraulic excavator 1.

It should be noted that in the embodiment, the explanation is made of the example where the voltage difference of the battery cell is managed to calculate the vehicle rest possible period and output the warning information. However, not limited thereto, for example, the similar management is possible to the charge remaining amount as well, therefore making it possible to perform the management to prevent the over discharge. That is, the charge remaining amount is basically managed by SOC (State Of Charge), but the battery cell voltage can be converted into the SOC on a one-to-one basis, and the threshold value of the SOC for determination of the over discharge can be converted into the threshold value of the voltage. Therefore, the vehicle rest possible time for preventing the over discharge is calculated from the difference in the minimum voltage of the battery cell, making publication of the information and the outgoing of the warning information based thereupon possible.

As described above, according to the embodiment, the information of the electricity storage device 19 transmitted from the hydraulic excavator 1 as the construction machine is stored in the management server 52 as the management device. Specifically, the maximum value and the minimum value of the respective voltages of the plurality of battery cells 19A, 19A configuring the electricity storage device 19 in the hydraulic excavator 1 or the maximum value and the minimum value of the respective charging rates of the plurality of battery cells 19A, 19A are stored in the storage device 52A (battery cell state storing unit) in the management server 52. In addition, in the management server 52 the estimation maximum value and the estimation minimum value in the present or in the future are calculated by adding the discharge characteristics to the latest maximum value and the latest minimum value. That is, the battery state estimation calculating unit 52D (battery cell state calculating unit) in the management server 52 calculates the estimation maximum value and the estimation minimum value of the present or the future by adding the discharge characteristics stored in the storage device 52A (discharge characteristic storing unit) to the latest maximum value and the latest minimum value stored in the storage device 52A (battery cell state storing unit). Therefore, the management server 52 can manage the battery state of the electricity storage device 19 (for example, the voltage difference and the charging rate difference in the battery cells 19A, 19A) during the non-operating time of the hydraulic excavator 1 based upon the estimation maximum value and the estimation minimum value. That is, the management server 52 can estimate the voltage difference (or the charging rate difference) in the battery cells 19A, 19A during the long-term vehicle rest time as well, and can confirm the battery state of the electricity storage device 19 based upon the estimated voltage difference (or the estimated charging rate difference).

In addition, the management server 52 outputs the information based upon the estimation maximum value and the estimation minimum value (for example, an estimation voltage difference, an estimation charging rate difference, a vehicle rest possible period calculated thereby, or the like). That is, the management information producing unit 52C in the management server 52 outputs the battery information calculated in the battery state estimation calculating unit 52D (battery cell state calculating unit). Thereby, it is possible to notify that the voltage difference (or the charging rate difference) in the battery cells 19A, 19A becomes large and the operation (for example, the maintenance operation) of the hydraulic excavator 1 is necessary, and the like. Therefore, based upon this output (notification), the manager (for example, the owner, the user, the operator or the maintenance responsible member) of the hydraulic excavator 1 can take the measures (for example, the maintenance operation) before the operation of the hydraulic excavator 1 is restricted due to the voltage difference (or the charging rate difference) of the battery cells 19A, 19A or before it is difficult to cause the hydraulic excavator 1 to operate. As a result, it is possible to suppress the restriction on the operation of the hydraulic excavator 1 or the hydraulic excavator 1 from being incapable of being used after the long-term vehicle rest of the hydraulic excavator 1.

According to the embodiment, the discharge characteristics are updated based upon the past maximum value and the past minimum value in the management server 52, and the updated discharge characteristics are stored therein. That is, in the self-discharge characteristic calculating unit 52B (discharge characteristic updating unit) in the management server 52, the discharge characteristics are updated based upon the past maximum value and the past minimum value stored in the storage device 52A (battery cell state storing unit). The updated discharge characteristics by the self-discharge characteristic calculating unit 52B (discharge characteristic updating unit) are stored in the storage device 52A (discharge characteristic storing unit) in the management server 52. In addition, in the management server 52 the estimation maximum value and the estimation minimum value in the present or in the future are calculated by adding the updated discharge characteristics to the latest maximum value and the latest minimum value. That is, the battery state estimation calculating unit 52D (battery cell state calculating unit) in the management server 52 calculates the estimation maximum value and the estimation minimum value of the present or the future by adding the updated discharge characteristics stored in the storage device 52A (discharge characteristic storing unit) to the latest maximum value and the latest minimum value stored in the storage device 52A (battery cell state storing unit). Therefore, by updating the self-discharge characteristics to be used for the estimation (calculation) of the battery state based upon the battery state information during the operating of the hydraulic excavator 1, it is possible to optimize this battery state information. As a result, the estimation accuracy on the battery state can improve.

According to the embodiment, the maximum value, the minimum value and the discharge characteristics are stored for each of the electricity storage devices 19 in the management server 52. That is, the maximum value and the minimum value are stored for each of the electricity storage devices 19 in the storage device 52A (battery cell state storing unit) in the management server 52. In addition, the discharge characteristics are stored for each of the electricity storage devices 19 in the storage device 52A (discharge characteristic storing unit) in the management server 52. Therefore, it is possible to make the estimation (calculation) of the battery state for each of the electricity storage devices 19 with good accuracy regardless of a variation for each of the electricity storage devices 19.

According to the embodiment, the management server 52 calculates the vehicle rest possible period of the hydraulic excavator 1 based upon the calculated estimation maximum value and the calculated estimation minimum value in the future, and outputs the information of the calculated vehicle rest possible period. That is, in the battery state estimation calculating unit 52D (vehicle rest possible period calculating unit) in the management server 52, the vehicle rest possible period of the hydraulic excavator 1 that becomes a period until the restriction on use of the electricity storage device 19 starts, is calculated based upon the estimation maximum value and the estimation minimum value in the future calculated in the battery state estimation calculating unit 52D (battery cell state calculating unit). In addition, the management information producing unit 52C (output unit) in the management server 52 outputs information of the vehicle rest possible period calculated in the battery state estimation calculating unit 52D (vehicle rest possible period calculating unit). Therefore, the manager (for example, the owner, the user, the operator or the maintenance responsible member) of the hydraulic excavator 1 can take the measures necessary before the vehicle rest possible period outputted from the management server 52 goes by, for example, can perform the operation (the maintenance operation) of the hydraulic excavator 1. As a result, it is possible to suppress the restriction on the operation of the hydraulic excavator 1 or the hydraulic excavator 1 from being incapable of being used.

According to the embodiment, the management server 52 outputs the vehicle rest possible period or the warning information based upon the vehicle rest possible period to the information terminals 54, 55 to be used by the manager of the hydraulic excavator 1. That is, the management information producing unit 52C (output unit) in the management server 52 outputs the vehicle rest possible period calculated in the battery state estimation calculating unit 52D (vehicle rest possible period calculating unit) or the warning information based upon the vehicle rest possible period to the information terminals 54, 55 to be used by the manager of the hydraulic excavator 1. Therefore, the manager of the hydraulic excavator 1 can take the measures necessary before the vehicle rest possible period goes by, for example, can perform the operation (the maintenance operation) of the hydraulic excavator 1, based upon the vehicle rest possible period outputted to the information terminals 54, 55 from the management server 52 or the warning information based upon the vehicle rest possible period. As a result, it is possible to suppress the restriction on the operation of the hydraulic excavator 1 or the hydraulic excavator 1 from being incapable of being used.

It should be noted that in the embodiment, a case of outputting the vehicle rest possible period or the warning information based upon the vehicle rest possible period to the information terminals 54, 55 to be used by the manager of the hydraulic excavator 1 from the management information producing unit 52C (output unit) is explained as an example. However, not limited thereto, the output unit (management information producing unit 52C) may output information other than the vehicle rest possible period or the warning information based upon the vehicle rest possible period. That is, the output unit (management information producing unit 52C) may output information of the battery state (for example, the estimation maximum value and the estimation minimum value of the cell voltage or the like) calculated in the battery cell state calculating unit (battery state estimation calculating unit 52D) to the information terminals 54, 55.

In the embodiment, the explanation is made by taking as an example a case where in the self-discharge characteristic calculating unit 52B (discharge characteristic updating unit), the discharge characteristics are updated based upon the maximum value and the minimum value in the cell voltage in the past (that is, a relation between the maximum value and the minimum value in the cell voltage obtained until the present point), and the estimation maximum value and the estimation minimum value of the cell voltage are calculated using the updated discharge characteristics. However, not limited thereto, the estimation maximum value and the estimation minimum value of the cell voltage may be calculated using preset discharge characteristics without updating the discharge characteristics.

In the embodiment, the hybrid hydraulic excavator 1 of driving the hydraulic pump 12 by the engine 11 as an internal combustion engine and the assist power generation motor 15 as an electric motor is explained as an example. However, not limited thereto, the present invention may be applied to an electric hydraulic excavator of driving a hydraulic pump by an electric motor, for example. In addition, a case of using hydraulic actuators, such as hydraulic cylinders and hydraulic motors, as actuators for operating the hydraulic excavator 1 is explained as an example. However, not limited thereto, electric actuators may be used in place of the hydraulic actuators, for example.

The embodiment is explained by taking the hydraulic excavator 1 of a crawler type as the construction machine, as an example. However, not limited thereto, the present invention can be widely applied to various kinds of construction machines such as a wheel type hydraulic excavator, a hydraulic crane, a wheel loader, a dump truck and a bulldozer.

DESCRIPTION OF REFERENCE NUMERALS

1: Hydraulic excavator (Construction machine)
19: Electricity storage device
19A: Battery cell
24: Communication device
52: Management server (Management device)
52A: Storage device (Battery cell state storing unit, discharge characteristic storing unit)
52B: Self-discharge characteristic calculating unit (Discharge characteristic updating unit)
52C: Management information producing unit (Output unit)
52D: Battery state estimation calculating unit (Battery cell state calculating unit, vehicle rest possible period calculating unit)
54, 55: Information terminal

The invention claimed is:

1. An electricity storage device management computer for a construction machine provided with a management computer that is disposed in a position away from the construction machine including an electricity storage device and a communication device and manages the electricity storage device by receiving information of the electricity storage device transmitted through the communication device from the construction machine, characterized in that:
the information of the electricity storage device includes a maximum value and a minimum value of one of respective voltages or respective charging rates in a plurality of battery cells configuring the electricity storage device,
the management computer stores discharge characteristics of the electricity storage device in advance,
the management computer records the maximum value and the minimum value received from the construction machine, and
the management computer:
calculates a period until a difference between future values of the maximum value and the minimum value reaches a threshold value as a vehicle rest possible period of the construction machine that becomes a period until a restriction on use of the electricity storage device starts, based upon most recently recorded values of the maximum value and the minimum value and the discharge characteristics; and
outputs the calculated vehicle rest possible period or warning information that is based upon the calculated vehicle rest possible period to an information terminal to be used by a manager of the construction machine.

2. The electricity storage device management computer for the construction machine according to claim 1, wherein the management computer:
updates the discharge characteristics based upon the maximum value and the minimum value recorded in the management computer;
records the updated discharge characteristics; and
calculates the vehicle rest possible period based upon the most recently recorded values of the maximum value and the minimum value in the management computer and the updated discharge characteristics recorded in the management computer.

3. The electricity storage device management computer for the construction machine according to claim 2, wherein the management computer records the maximum value, the minimum value and the updated discharge characteristics for each of a plurality of construction machines in the case of the plurality of construction machines having the electricity storage device and the communication device.

* * * * *